United States Patent
Franz et al.

(10) Patent No.: US 10,888,031 B2
(45) Date of Patent: Jan. 5, 2021

(54) MEMORY DEVICE WITH MEMORY MODULES LOCATED WITHIN LIQUID COOLANT CHAMBER

(71) Applicant: HEWLETT PACKARD ENTERPRISE DEVELOPMENT LP, Houston, TX (US)

(72) Inventors: John Franz, Houston, TX (US); Vincent W Michna, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 115 days.

(21) Appl. No.: 15/714,811

(22) Filed: Sep. 25, 2017

(65) Prior Publication Data

US 2019/0098798 A1 Mar. 28, 2019

(51) Int. Cl.
*H05K 7/20* (2006.01)
*G06F 1/20* (2006.01)
(Continued)

(52) U.S. Cl.
CPC ......... *H05K 7/20772* (2013.01); *G06F 1/185* (2013.01); *G06F 1/20* (2013.01); *G06F 13/00* (2013.01); *G11C 29/56016* (2013.01); *H01L 23/473* (2013.01); *H05K 1/181* (2013.01); *H05K 7/1427* (2013.01); *H05K 7/20236* (2013.01); *H05K 7/20254* (2013.01);
(Continued)

(58) Field of Classification Search
CPC ....... G06F 1/181–182; H05K 7/20218–20381; H05K 7/20409–20418; H05K 7/20009–202; H05K 5/00–069; H05K 7/00–186; H05K 7/20772; H05K 7/1427; H05K 7/20236; H05K 7/20272; H05K 7/20809; H05K 2201/10159; H05K 2201/10325; H05K 2201/10522; H05K 1/181; H05K 7/203; H01L 23/367–3677; H01L 23/473; H01L 23/46–467
USPC ...... 361/676–678, 679.46–679.54, 688–723, 361/699–704, 709–710, 719–721, 361/679.01–679.45, 679.55–679.61, 361/724–727; 165/80.1–80.5, 104.33, 165/185; 174/15.1–15.3, 16.1–16.3, 547, 174/548; 257/712–722, E23.088; 24/453, 458–459; 454/184; 312/236
See application file for complete search history.

(56) References Cited

U.S. PATENT DOCUMENTS 9,989,271 B1 * 6/2018 Becker .................. F24F 5/0021
2004/0136164 A1 * 7/2004 Morris ................... H05K 1/141
361/721

(Continued)

*Primary Examiner* — Robert J Hoffberg
(74) *Attorney, Agent, or Firm* — Hewlett Packard Enterprise Patent Department

(57) ABSTRACT

An example memory device includes a printed circuit board, a case, a bus, and memory modules. The case includes a number of walls, and at least some of the walls and the printed circuit board together form a liquid coolant chamber that is liquid-tight (excluding any hose connectors). The bus includes memory sockets connected to the printed circuit board and located within the liquid coolant chamber, and the memory modules are installed in the memory sockets and within the liquid coolant chamber. The bus also includes a connector to connect to a memory bus of a main printed circuit board of a computing device, the connector being external to the liquid coolant chamber.

17 Claims, 13 Drawing Sheets

(51) Int. Cl.
  *H01L 23/473* (2006.01)
  *H05K 7/14* (2006.01)
  *H05K 1/18* (2006.01)
  *G06F 1/18* (2006.01)
  *G11C 29/56* (2006.01)
  *G06F 13/00* (2006.01)
  *G11C 5/04* (2006.01)

(52) U.S. Cl.
  CPC ..... *H05K 7/20272* (2013.01); *H05K 7/20509* (2013.01); *G06F 2200/201* (2013.01); *G11C 5/04* (2013.01); *H05K 2201/10159* (2013.01); *H05K 2201/10325* (2013.01); *H05K 2201/10522* (2013.01)

(56) References Cited

U.S. PATENT DOCUMENTS

| | | | |
|---|---|---|---|
| 2007/0023169 A1* | 2/2007 | Mahalingam | F25D 17/02 165/104.28 |
| 2007/0183125 A1* | 8/2007 | Tilton | H01L 23/4735 361/699 |
| 2008/0017355 A1* | 1/2008 | Attlesey | G06F 1/181 165/104.33 |
| 2009/0080152 A1* | 3/2009 | Conn | H01L 24/29 361/679.53 |
| 2009/0129012 A1* | 5/2009 | Legen | G06F 1/20 361/690 |
| 2009/0251857 A1* | 10/2009 | Legen | H01L 23/4093 361/689 |
| 2009/0277616 A1* | 11/2009 | Cipolla | F28D 15/0233 165/104.33 |
| 2010/0085712 A1* | 4/2010 | Hrehor, Jr. | H05K 7/20254 361/699 |
| 2011/0069454 A1* | 3/2011 | Campbell | H05K 7/2079 361/700 |
| 2011/0315344 A1* | 12/2011 | Campbell | F28F 3/04 165/80.4 |
| 2012/0020004 A1* | 1/2012 | Rau | G06F 1/20 361/679.31 |
| 2012/0020022 A1* | 1/2012 | Peterson | G06F 1/20 361/699 |
| 2013/0120926 A1* | 5/2013 | Barina | H01L 23/4093 361/679.32 |
| 2013/0194745 A1* | 8/2013 | Meijer | G06F 1/20 361/679.47 |
| 2014/0111943 A1* | 4/2014 | Stanley | H01L 23/3733 361/709 |
| 2014/0233175 A1* | 8/2014 | Demange | H05K 7/20254 361/679.47 |
| 2014/0240930 A1* | 8/2014 | Arvelo | H05K 7/2039 361/721 |
| 2014/0301031 A1* | 10/2014 | Louvar | G06F 1/185 361/679.31 |
| 2015/0075000 A1* | 3/2015 | Cox | H01L 23/367 29/890.03 |
| 2015/0212555 A1* | 7/2015 | Cox | H01L 23/427 361/679.52 |
| 2015/0359132 A1* | 12/2015 | Campbell | H05K 7/20236 361/700 |
| 2015/0359140 A1* | 12/2015 | Arvelo | H05K 7/20772 361/699 |
| 2017/0088446 A1* | 3/2017 | Hughes | C02F 1/487 |
| 2018/0018000 A1* | 1/2018 | Cader | H05K 7/20772 |
| 2018/0069359 A1* | 3/2018 | Muller | H01R 9/2658 |
| 2020/0084914 A1* | 3/2020 | Kumagai | H01L 23/44 |

* cited by examiner

MEMORY DEVICE WITH MEMORY MODULES LOCATED WITHIN LIQUID COOLANT CHAMBER

BACKGROUND

Computers may include memory modules. When in use, the memory modules may generate excessive heat, which may adversely affect the memory modules and/or other components of the computer. A memory module cooler may be used to cool the memory modules. For example, in some approaches memory modules are installed in a computer's main printed circuit board ("PCB") (e.g., motherboard), which includes the processor(s) of the computer, and then a memory module cooler is attached to the main PCB and/or the memory modules so as to cool the memory modules.

The memory module cooler may include a number of interface elements (usually metallic) that are to come into contact with the memory modules (directly or via a thermal interface material) to remove heat therefrom. The interface elements may then transfer the heat (directly, or through intermediaries) to a heat removing medium, such as air or liquid coolant, which ultimately removes the heat from the computer (e.g., the air is blown out of the computer, the liquid coolant releases the heat in a heat exchanger, etc.).

DETAILED DESCRIPTION

1—Memory Devices: Overview

Figure 1:
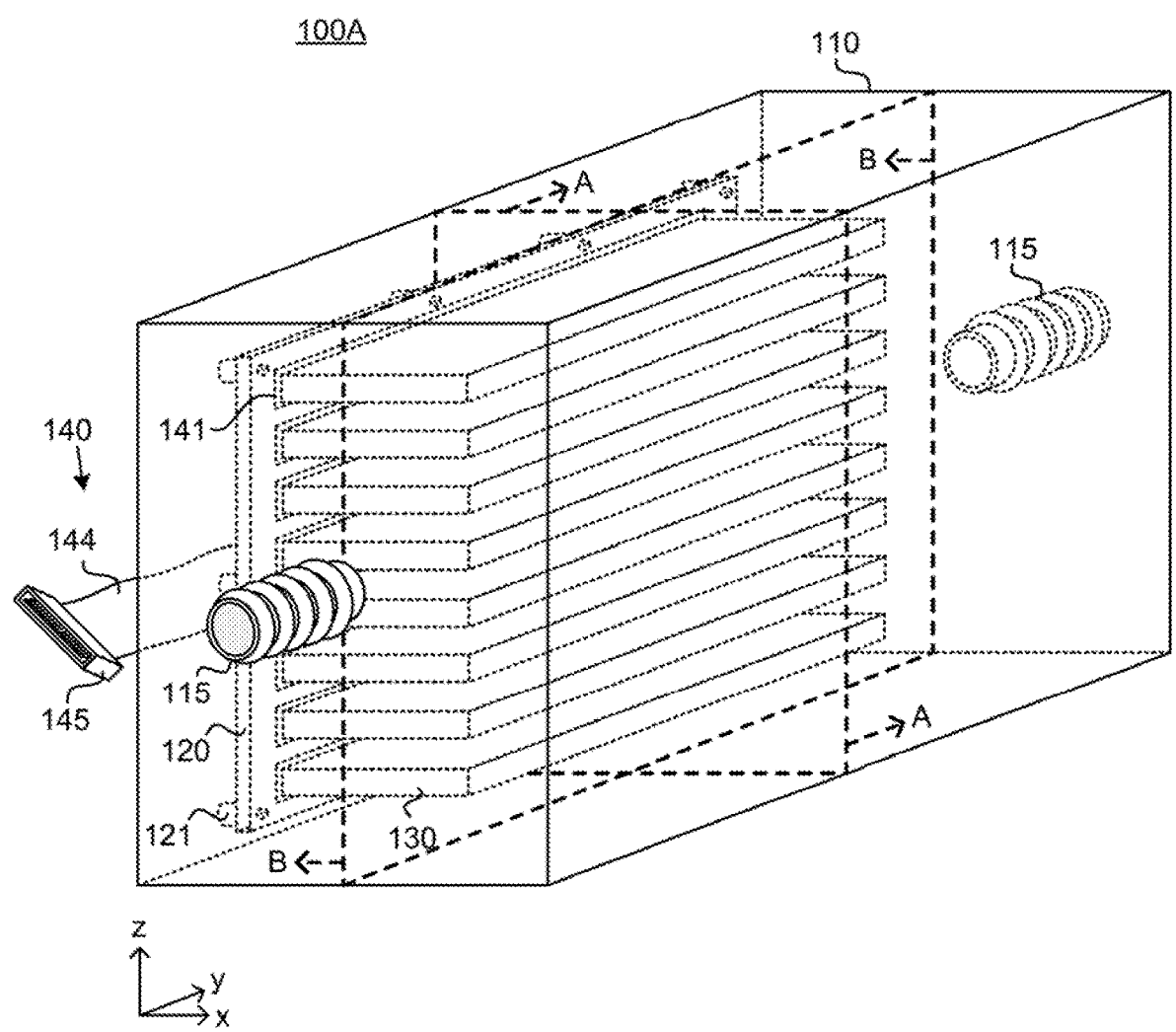
FIG. 1 illustrates a perspective view of a first example memory device. Visible features are shown using solid lines and certain hidden features are shown using short-dashed lines.
Figure 2:
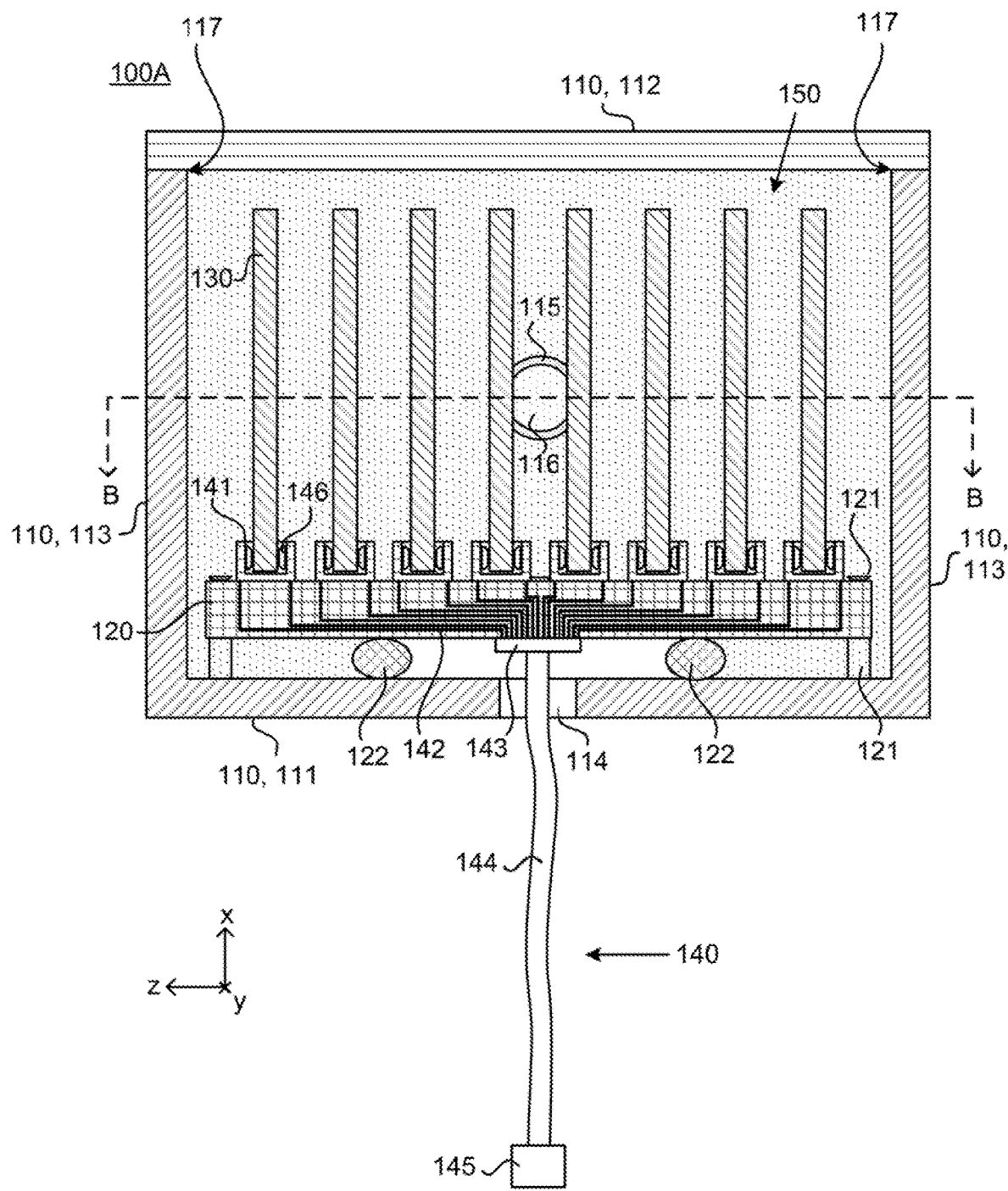
FIG. 2 illustrates a cross-sectional view of the first example memory device. The cross-section is taken along the plane/line A-A.
Figure 3:
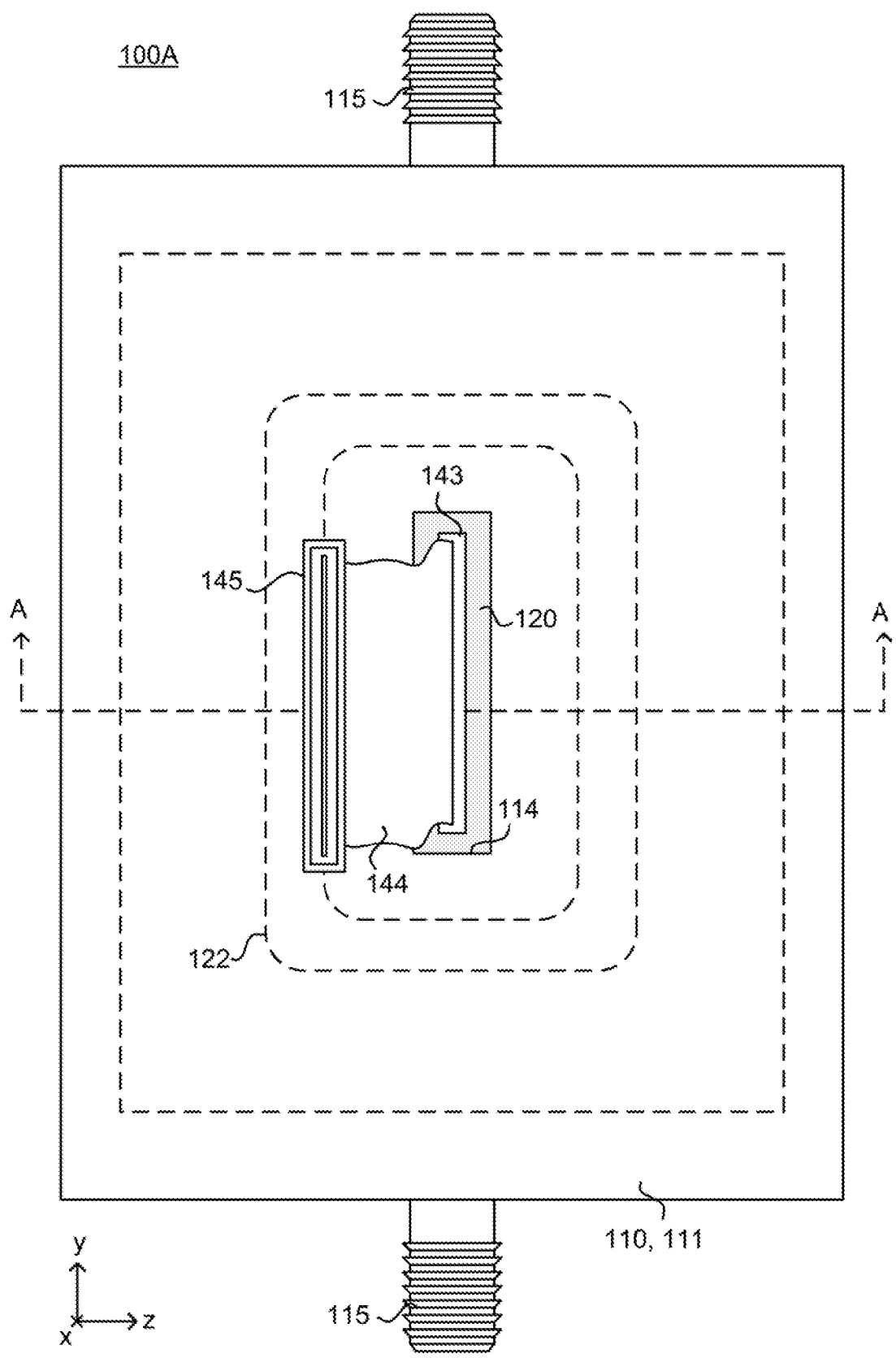
FIG. 3 illustrates a bottom-up plan view of the first example memory device.
Figure 4:
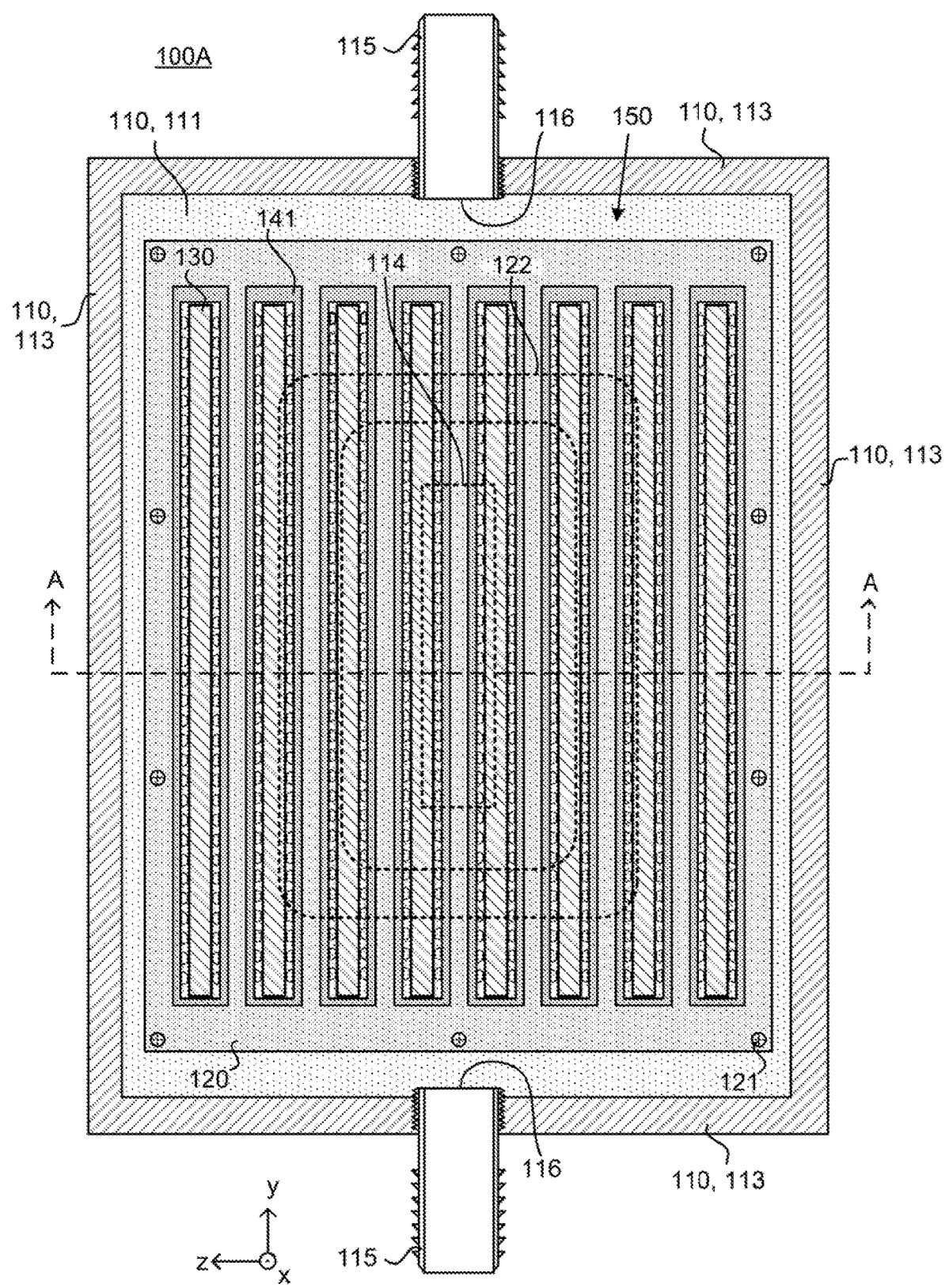
FIG. 4 illustrates a cross-sectional view of the first example memory device, with the cross-section taken along the line/plane B-B

In contrast to approaches in which memory modules are installed in a computer's main PCB and then a memory module cooler is attached to the main PCB and/or the memory modules, in examples disclosed herein the memory modules and liquid cooling elements may be integrated together within a packaged device (hereinafter, "memory device") that is distinct from the main PCB. In particular, the example memory device may include a liquid coolant chamber, and the memory modules may be disposed within the liquid coolant chamber such that, when liquid coolant is added to the chamber, the liquid coolant surrounds and directly contacts the memory modules. Thus, in such examples the memory modules are not directly installed in memory sockets of the main PCB of the computer, and instead an external connector of the example memory device may be communicably connected to the main PCB to enable communication between the processor(s) and the memory modules.

Specifically, an example memory device may include a case (distinct from a case of the computer in which the memory device is to be installed) that contains a PCB (distinct from the main PCB of the computer in which the memory device is to be installed) (hereinafter "ancillary PCB"). The ancillary PCB includes memory sockets, and may also include additional components such as a voltage regulation circuit for the memory sockets. The ancillary PCB and the walls of the memory device's case may together form the liquid coolant chamber mentioned above, which may contain both the memory modules and the liquid coolant. The ancillary PCB may be sealed to the case such that the liquid coolant chamber is liquid-tight (excluding hose connectors, if any).

The example memory device may also contain a memory bus, with one end of the memory bus terminating in memory sockets, another end of the memory bus terminating in the external connector mentioned above at the other end, and wirings connecting the memory sockets to the external connector. The memory sockets may be formed in and/or connected to the side of the ancillary PCB that faces the interior of the liquid coolant chamber, while the external connector may be exterior to the liquid coolant chamber. The memory modules may be installed in the memory sockets and located within the liquid coolant chamber.

In some examples, in addition to the external connector being exterior to the liquid coolant chamber, it may also be exterior to the case. In some of these examples the bus may extend from inside the case to outside the case through a hole in the case, with the PCB being sealed to the case around the hole to keep the liquid coolant chamber liquid tight.

In some examples, a memory device may include hose connectors that are to connect the interior of the liquid coolant chamber into a coolant flow of a liquid coolant system of the computer, thereby enabling liquid coolant of the liquid coolant system to flow through the liquid coolant chamber. In other examples, the liquid coolant chamber may be completely closed and have no hose connectors, in which case liquid coolant may be added to the liquid coolant chamber before sealing the chamber. In examples in which the liquid coolant chamber is not connected into a coolant flow of a liquid cooling system, the case of the memory device may be thermally coupled to a cold plate of a cooling system of the computer. For example, the memory device may include a heat transfer element to draw heat from the liquid coolant and transfer the heat to the cold plate.

In the example memory device, the liquid coolant is in contact with the memory modules and the memory sockets, and therefore in some examples the liquid coolant may be a dielectric liquid (such as mineral oil, silicone oil, Fluorinert™, Novec™, etc.) in order to avoid shorting out electrical circuits of the memory modules and/or memory sockets. In addition, dielectric liquids may also reduce the risk of corrosion of exposed metal contacts as compared to water or other liquid coolants.

1.1—Example Benefits

Because the memory modules are disposed within the liquid coolant chamber, they may be surrounded by and in direct contact with the liquid coolant. This may greatly increase the rate at which heat is transferred from the memory modules to the liquid coolant, thus improving the cooling of the memory modules.

For example, because the memory modules are submersed in the liquid coolant, almost an entire surface area of the memory modules may be in contact with the liquid coolant. Thus, the contact area of the coolant-module interface may be very close to the total surface area of the memory modules. Because the rate at which heat is transferred between the memory modules and the liquid coolant is dependent upon the size of the contact area between them, the large contact area of the coolant-module interface results in high rates of heat transfer.

One reason for there being such a large contact area is that, because the liquid coolant is a liquid, it may conform fluidly to the contours of the memory module's surface throughout any portion of the surface that the liquid coolant is able to impinge upon. In particular, the liquid coolant is able to flow around and/or into any irregularities in the surface of the memory module almost down to the molecular level, thus allowing continuous contact to be maintained between the liquid coolant and the memory module throughout the region of impingement. Moreover, all but very small portions of the memory module's surface area (which may be blocked, for example, by portions of the memory sockets), may be impinged upon by the liquid coolant. The fact that continuous contact is possible within areas impinged upon by the liquid coolant together with the fact that nearly all areas of the memory module are impinged upon by the liquid coolant, means that the contact area of the coolant-module interface is close to its maximum possible value.

In contrast, in approaches in which a memory module cooler is placed in contact with the memory modules to cool them, the contact area of the cooler-module interface is much smaller than the contact area of the liquid coolant-module interface. This may be due in part to the fact that the coolers may impinge upon a much smaller portion of the memory modules than the liquid coolant, as the solid interface elements of the coolers may be blocked by the geometry of the memory modules and the surrounding environ from impinging on portions of the memory module, which would not be blocked to the liquid coolant. Moreover, even for regions of the memory module in which the memory module coolers are able to impinge on the memory module, the cooler-module interface in that region is going to be imperfect as irregularities in the surface of the memory module (e.g., protrusions, depressions, rough surfaces, etc.) may prevent continuous contact for the memory modules coolers—a problem not suffered by the liquid coolant of the examples disclosed herein. Thus, heat is transferred from the memory module into the solid interface element of the memory module cooler at a much lower rate, meaning that heat is ultimately transferred to the heat removal medium (e.g., air, liquid coolant, etc.) at a much lower rate as well.

In some approaches, thermal interface material ("TIMs") (such as thermal grease, thermal gap filer, thermal pads, etc.) may be applied between a memory module and the interface element of the memory module cooler to improve the interface, as the TIM may be able to deal with surface irregularities better than a solid contact element. However, even in these approaches that use TIMs, the cooler-TIM-module interfaces may not be able to conduct heat as well as the liquid coolant-module interface, as the liquid coolant will generally be able to flow into places that the TIM cannot. Moreover, TIM may be difficult to apply correctly, and may complicate and/or increase the cost of installing memory modules in the computer.

In addition, because the liquid coolant is directly contacting the memory modules, the number of thermal interfaces between the memory modules and the ultimate heat removal medium may be less in some examples described herein than in approaches that use a memory module cooler. In particular, in approaches that use memory module coolers, the heat passes through at least one intermediary—the solid interface element—before reaching the heat removal medium, and thus there are at least two thermal interfaces to cross. In contrast, in some examples described herein the liquid coolant that is in contact with the memory modules is also the heat removal medium, and therefore there is just one thermal interface between the memory modules and the heat removal medium. Because each thermal interface has some finite resistance to heat conduction, having a lower number of thermal interfaces between the memory modules and the heat removal medium will, all other things being equal, result in a higher rate of heat transfer. Thus, even if the contact area of the memory module coolers could be made comparable to the contact area of the liquid coolant, the ultimate rate of heat transfer to the heat removing medium may still be lower for the memory module cooler approaches.

Furthermore, because the memory device may be provided as a pre-packaged unit that integrates the memory modules and the means for cooling them in the same device, it may be relatively easy to install into a computing device in comparison to installing a memory module cooler on memory modules. In particular, in installing a memory cooler it may be difficult to fit the memory modules into tight-fitting openings of the cooler, to properly install thermal interface materials, and so on. In addition, there is a risk of damaging the memory modules while installing the memory cooler. In contrast, in some examples the installation of the memory device in the computer may be as simple as plugging the external connector of the memory device into a corresponding connector of the main PCB, physically securing the memory device to the main PCB, and (in some examples) plugging hoses of a liquid cooling system, which may already be installed in the computer to cool other components, into the memory device. Moreover, in the example memory device the memory modules are protected from damage during installation by the case.

The example memory device may also provide benefits relative to approaches in which an entire computer or collection of computers is submerged in a vat of liquid coolant. In particular, although such approaches may result in good heat transfer between memory modules and the heat removal medium, they may be unwieldy in practice. For example, such systems may impose unique form factor requirements to accommodate the full submersion of the entire computer(s) (e.g., rack sized tanks or vats), which means that standard server and rack designs cannot be used for the system. The non-standard designs required by such systems may result in difficulties in the manufacturing and/or installation of such a system, as well as in integrating such a system into a data center. In addition, such systems are very costly—not only does the non-standard design impose costs, but in addition such systems may need large volumes of dialectic fluid, which can be very expensive. As another example, in approaches that submerge the entire computer(s), servicing any component of the computer may require a complex and/or messy process of draining the vat and/or removing the computer from the vat, which may also disrupt operations of other computers in the vat. In contrast, example memory devices disclosed herein may impose no unique requirements on server or rack design (aside from, in some examples, adding a connector to the main PCB that is compatible with the external connector of the memory device), and therefore standard server and rack designs may still be used with certain example memory devices. Moreover, installation of the example memory devices described herein may be relatively simple, as noted above. In addition, the cost of the example memory devices is relatively small in comparison with the cost of full-submersion approaches, as the volume of liquid coolant that is used may be much smaller. Furthermore, in examples disclosed herein the memory device may easily be removed/replaced from a computer in the field without the complexity and mess described above, and without disrupting other computers in the same rack.

2—Example Memory Device 100

Figure 5:
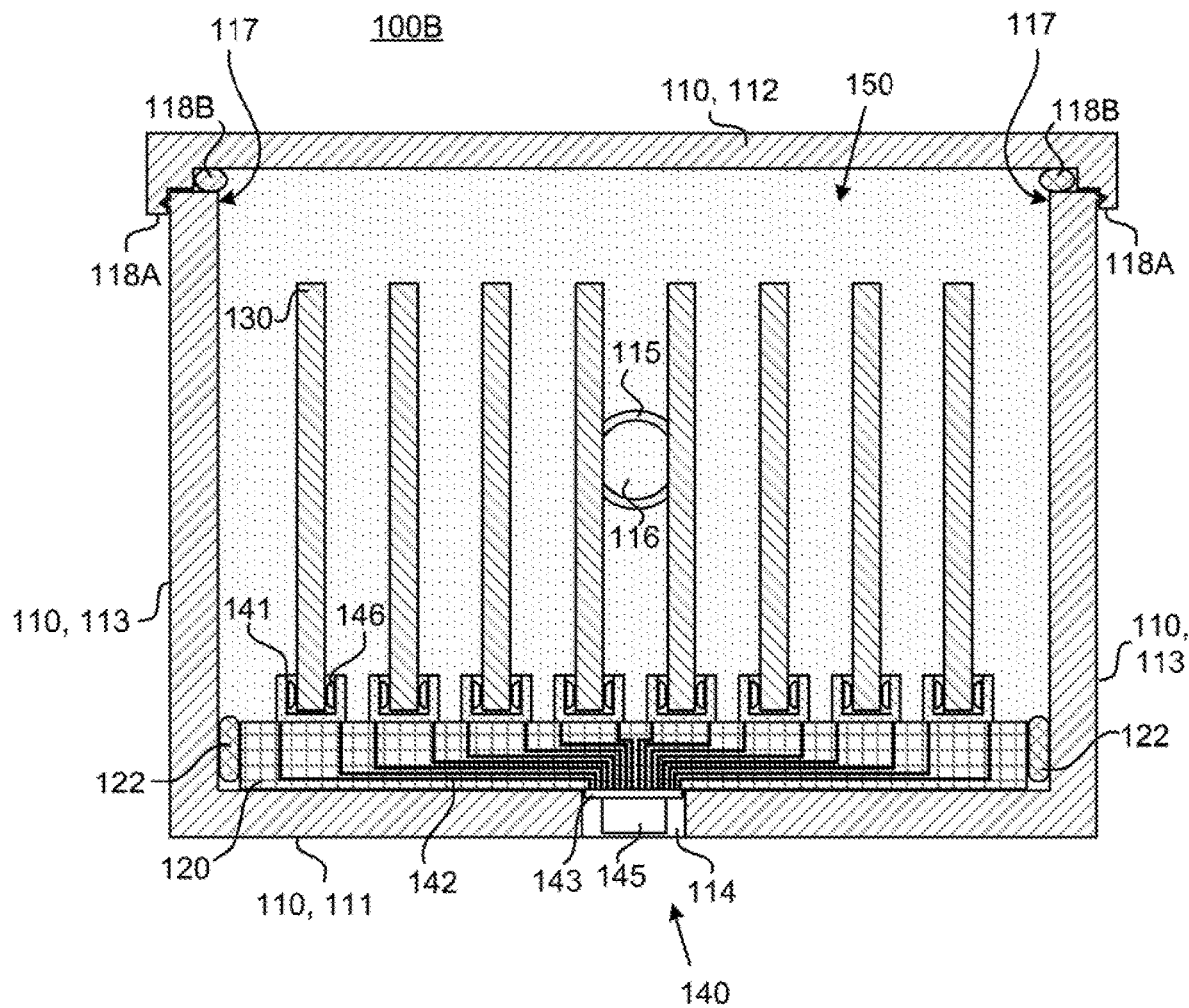
FIG. 5 illustrates a cross-sectional view of a second example memory device, which is a variation on the first example memory device. The cross-section is taken along a plane/line in the second example memory device that would correspond to the plane/line A-A in the first example memory device.
Figure 6:
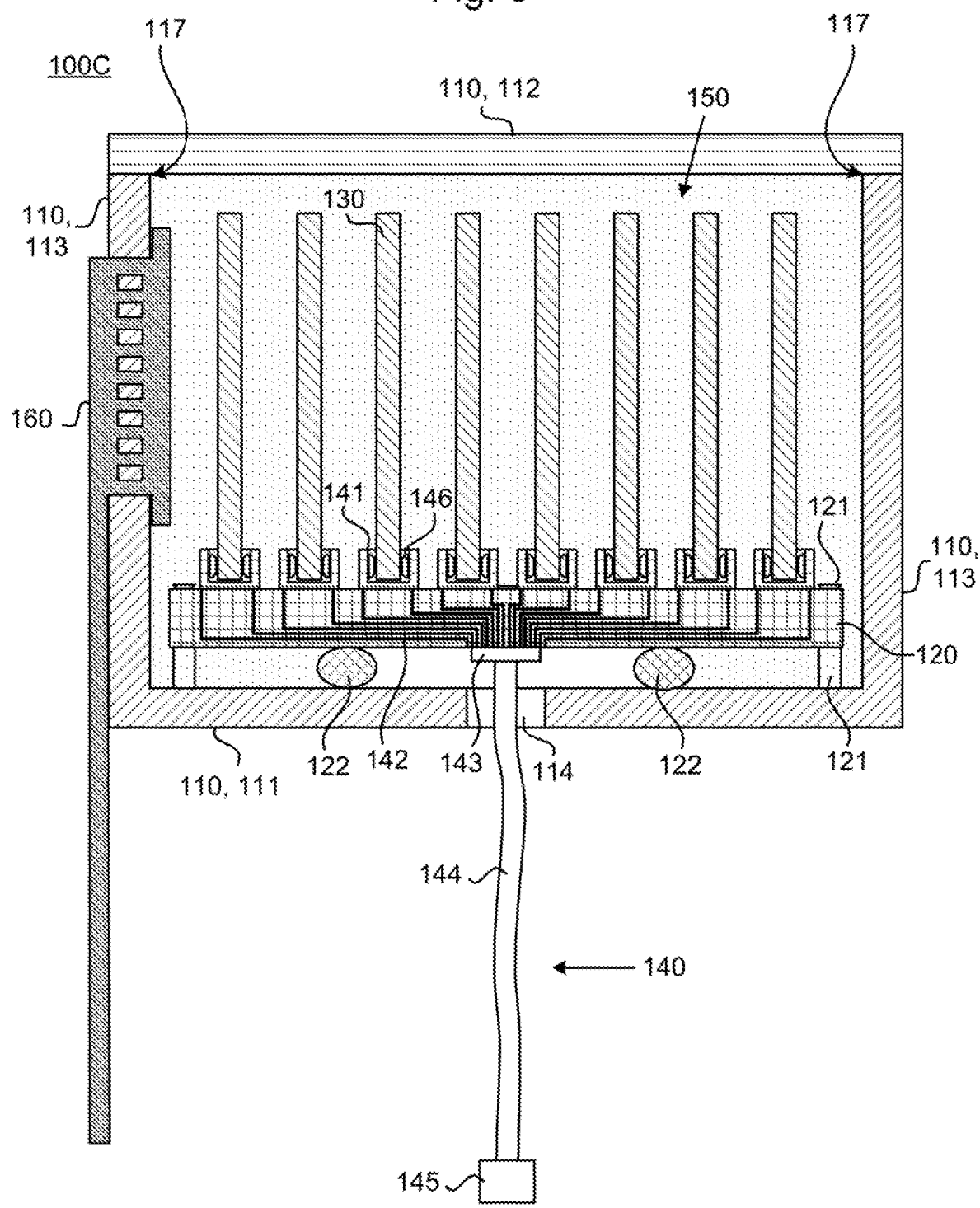
FIG. 6 illustrates a cross-sectional view of a third example memory device, which is a variation on the first example memory device. The cross-section is taken along a plane/line in the third example memory device that would correspond to the plane/line A-A in the first example memory device.
Figure 7:
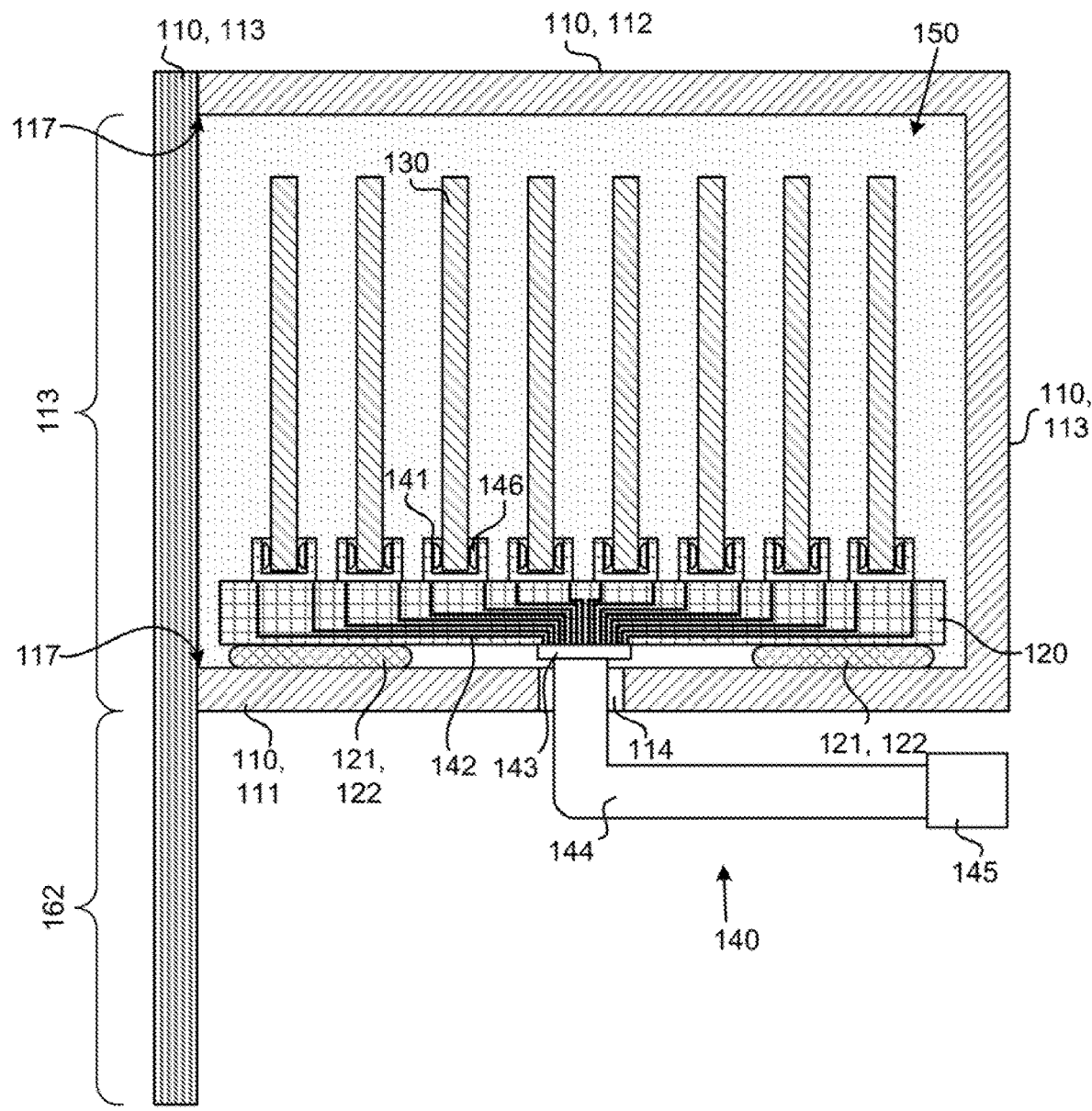
FIG. 7 illustrates a cross-sectional view of a fourth example memory device, which is a variation on the first example memory device. The cross-section is taken along a plane/line in the fourth example memory device that would correspond to the plane/line A-A in the first example memory device.
Figure 8:
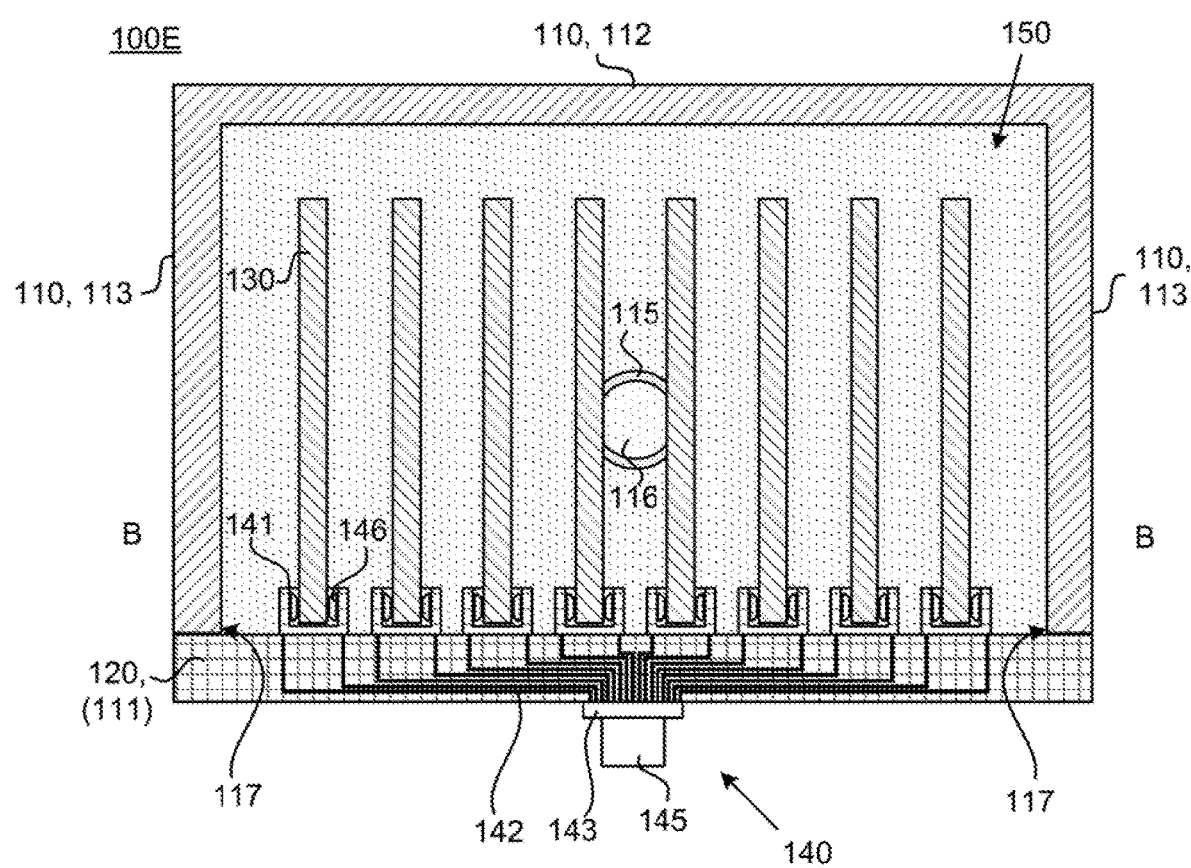
FIG. 8 illustrates a cross-sectional view of a fifth example memory device, which is a variation on the first example memory device. The cross-section is taken along a plane/line in the fifth example memory device that would correspond to the plane/line A-A in the first example memory device.
Figure 9:
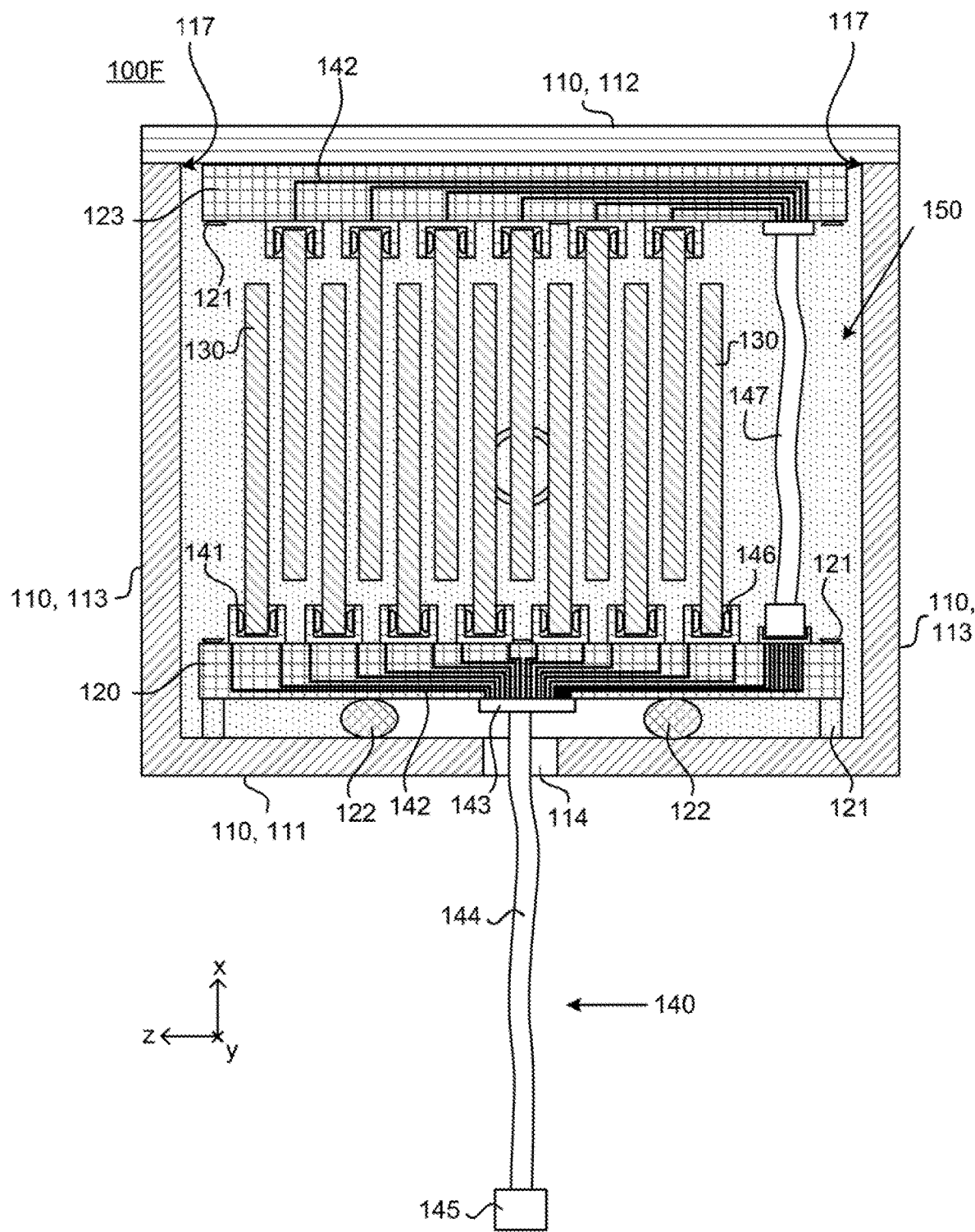
FIG. 9 illustrates a cross-sectional view of a sixth example memory device, which is a variation on the first example memory device. The cross-section is taken along a plane/line in the fifth example memory device that would correspond to the plane/line A-A in the first example memory device.

An example memory device 100 is described below with reference to FIGS. 1-9. The example memory device 100 is one specific example of the memory devices described herein. Certain features of the memory device 100 may be implemented in multiple ways, and some of these feature variations are illustrated in a number of example implementations of the memory device 100. In particular, FIGS. 1-4 illustrate a first example implementation of the memory device 100 (hereinafter, "implementation 100A"), FIG. 5 illustrates a second example implementation of the memory device 100 (hereinafter, "implementation 100B"), FIG. 6 illustrates a third example implementation of the memory device 100 (hereinafter, "implementation 100C"), FIG. 7 illustrates a fourth example implementation of the memory device 100 (hereinafter, "implementation 100D"), FIG. 8 illustrates a fifth example implementation of the memory device 100 (hereinafter, "implementation 100E"), and FIG. 9 illustrates a sixth example implementation of the memory device 100 (hereinafter, "implementation 100F"). In the Figures, features that are similar to one another are given the same reference signs, and duplicative descriptions of such features are omitted.

2.1—Example Memory Device 100: Overview

As illustrated in FIGS. 1-9, the memory device 100 includes a case 110, a printed circuit board ("PCB") 120, memory modules 130, and a memory bus 140.

The case 110 comprises a number of walls (see FIGS. 1-9), and at least some of the walls and the printed circuit board 120 together form a liquid coolant chamber 150 that is liquid-tight (excluding any hose connectors) (see FIGS. 2-9). The walls of the case 110 may include a bottom wall 111 (see FIGS. 2-9), a top wall 112 (see FIGS. 2 and 5-9), and side walls 113 (see FIGS. 2-9). In some examples, the PCB 120 may act as one of the walls of the case 110—for example, the PCB 120 may act as the bottom wall 111 of the case 100 (see FIG. 8). In other examples, the PCB 120 is contained within the case 110 and does not act as one of the walls of the case 110 (see FIGS. 1-9).

The memory bus 140 includes: (1) memory sockets 141 connected to the PCB 120 and located within the liquid coolant chamber 150, (2) an external connector 145 to connect to a memory bus of a main printed circuit board of a computing device, wherein the external connector 145 is external to the liquid coolant chamber 150, and (3) wirings (such as the wirings 142 and/or 144) that connect the memory sockets 141 to the external connector 145 (see FIGS. 1-9).

The memory modules 130 are installed in the memory sockets 141, with the memory modules 130 being within the liquid coolant chamber 150 (see FIGS. 1-9).

In addition, the memory device 100 includes at least one of: (1) liquid coolant within the liquid coolant chamber 150, and (2) a number of hose connectors 115 to connect the liquid coolant chamber 150 to a liquid cooling system of the computing device (see FIGS. 1-5 and 8). Specifically, in some examples, such as implementations 100C and 100D, the memory device 100 has liquid coolant added to the liquid coolant chamber 150 during manufacture of the memory device 100, and the liquid coolant remains entirely within the liquid coolant chamber 150 during operation of the memory device 100 (see FIGS. 6 and 7). In other examples, such as implementations 100A, 100B, 100E, and 100F, the memory device 100 is connected into a liquid coolant system via hose connectors 115, and liquid coolant from the liquid coolant system flows through the liquid coolant chamber 150 during operation of the memory device 100 (see FIGS. 2-5, 8, and 9).

2.2—the Liquid Coolant Chamber 150

As noted above, the liquid coolant chamber 150 is a liquid-tight chamber that is formed by walls of the case 110 and the PCB 120. In particular, the liquid-tight liquid coolant chamber 150 may be formed within the case 110 by (A) sealing the walls of the case 110 to one another, and (B) sealing at least a portion of the PCB 120 to at least one of the walls of the case 110. In FIGS. 2 and 4-9, regions corresponding to the liquid coolant chamber 150 are indicated by dotted hashing.

In this context, "sealing" two objects together refers to physically fastening the objects together in a manner that forms a liquid-tight seal at their interface. In some examples, a single mechanism may provide both physical fastening and liquid-tight sealing (e.g., an adhesive that bonds two walls together), while in other examples multiple mechanisms may cooperate together to provide the physical fastening and the liquid-tight seal (e.g., mechanical fasteners for the physical fastening and a gasket for the liquid-tight seal).

For example, two walls of the case 110 may be sealed to one another because they are part of the same continuous body, for example, they may be integrally formed together via injection molding. For example, the side walls 113 of the case 110 may be part of the same continuous body (see FIGS. 1-8). As another example, the bottom wall 111 and the side walls 113 may be part of the same continuous body (see FIGS. 1-7).

As another example, two physically distinct walls of the case 110 (or a wall and the PCB 120) may be permanently sealed together by, for example, using heat to fuse the walls together or adhesives to chemically bind the walls together. For example, in FIGS. 1-4 and 6-8 the top wall 112 is physically distinct from the side walls 113, and is permanently sealed to the side walls 113.

As another example, two physically distinct walls of the case 110 (or a wall and the PCB 120) may be reversibly sealed together by, for example, using releasable mechanical fasteners and a sealing element such as a gasket, caulking, sealant, etc. For example, in FIG. 5 the top wall 112 is reversibly sealed to the side walls 113 by using releasable mechanical fasteners 118A (such as a latch formed by a notch in the top wall 112 and a complementary flange protruding from the side walls 113) and a sealing element 118B (such as a gasket). Reversible sealing may be used, for example, when it is desired to allow the memory device 100 to be opened in the field, for example to allow field-servicing of the memory modules 130. Reversible sealing may be avoided, for example, when it is desired to ensure that the memory device 100 is not opened in the field, for example to prevent liquid coolant spills; in such examples, if a memory modules 130 requires servicing, the entire memory device 100 may be field replaced.

In some examples, such as example implementation 100E, the PCB 120 serves as the bottom wall 111 of the case 120, in which case the liquid coolant chamber 150 is formed by sealing the PCB 120 to each of the side walls 113. In such examples, the PCB 120 may be sealed to either the bottom sides of the side walls 113 (see FIG. 8) or to the inward facing sides of the side walls 113 (not illustrated), for example by using any combination of adhesives, mechanical fasteners, and/or sealants. For example, in implementation 100E the PCB 120 is bonded to the side walls 113 via adhesives (see FIG. 8). Thus, in these examples, the liquid coolant chamber 150 may correspond generally to the volume bounded by the top side of the PCB 120 and the interior facing sides of the side walls 113 and the top wall 112.

In other examples, such as the example implementations 100A-100D, the case 110 includes a bottom wall 111 that is distinct from the PCB 120, and the PCB 120 is contained fully within the case 110. In some of these examples, the PCB 120 may be sealed to the bottom wall 111 (see FIGS. 2, 6, and 7), in which case the liquid coolant chamber 150 may include the volume between the top side of the PCB 120, the side walls 113, and the top wall 112, and may also include portions that extend around the sides and bottom of the PCB 120. In others of these examples, the PCB 120 may be sealed to the side walls 113 (see FIG. 5), in which case the liquid coolant chamber 150 may include generally the volume between the top side of the PCB 120, the side walls 113, and the top wall 112.

In the examples in which the case 110 includes a bottom wall 111 that is distinct from the PCB 120, because the PCB 120 is disposed within the case 110 a hole 114 may be provided in the case 110 through which the memory bus 140 may extend and/or through which the memory bus 140 may be accessed from an outside of the case 110 (see FIGS. 1-7). In such examples, the sealing between the PCB 120 and the case 110 may be such that the liquid coolant chamber 150 is liquid tight relative to the hole 114. For example, a sealing mechanism 122 may be placed to fully surround the hole 114 between the PCB 120 and the bottom wall 111 and/or side walls 113.

For example, in implementations 100A & 100C, a gasket 122 (an example of the sealing mechanism 122) is disposed between the PCB 120 and the bottom wall 111 surrounding the hole 114. In these examples, mechanical fasteners 121 may be used to fasten the PCB 120 to the bottom wall 111, and may also compress the gasket 120 sufficiently to create a liquid-tight seal at the gasket 120.

As another example, in implementations 100B & 100D, an adhesive sealant 122 (e.g., silicone sealant, caulk, etc.) (another example of the sealing mechanism 122) provides both physical fastening and liquid-tight sealing between the PCB 120 and the case 110. For example, in implementation 100B the sealant 122 is disposed around the perimeter of the PCB 120 between the PCB 120 and the side walls 113 (see FIG. 5), while in implementation 100C the sealant 122 is disposed between the PCB 120 and the bottom wall 111 surrounding the hole 114 (See FIG. 7). In some examples, mechanical fasteners 121 may also help physically connect the PCB 120 to the case 110 (not illustrated), while in other examples such mechanical fasteners 121 may be omitted.

Because the liquid coolant chamber 150 is liquid-tight once the walls of the case 110 and the PCB 120 have all been sealed to one another, the memory modules 130 (and, in some cases, other components such as the PCB 120) need to be installed within the case 110 before the walls of the case 110 and the PCB 120 have all been fully sealed. In particular, at some point during manufacture of the memory device 100, at least one of the walls of the case 110 may be fully or partially disconnected from the other walls of the case 110, thus providing an opening 117 to an interior of the case 110 through which the memory modules 130 (and other components) may be inserted. After the memory modules 130 (and other components) are installed, the disconnected wall may be sealed to the other walls of the case 110 to close the opening 117 and form the liquid coolant chamber 150.

For example, in implementations 100A-E, five walls of the case 110 are integrally formed as part of the same continuous body (hereinafter a "case body") while the other one of the walls of the case 110 (hereinafter a "case lid") is initially disconnected from the case body. Thus, while the case lid is disconnected from the case body, there is an opening 117 in the case body, which is ultimately closed by sealing the case lid to the case body. For example, in implementations 100A-C, the top wall 112 of the case 110 is the case lid. As another example, in implementation 100D one of the side walls 113 is the case lid. As another example, in implementation 100E, the PCB 120 acts as the bottom wall 111 of the case 110, and the PCB 120 is the case lid.

In implementations 100A-D, the PCB 120 and the sealing mechanism 122 are inserted into the case body through the opening 117 while the case lid is disconnected from the case body. Thereafter, the PCB 120 may be sealed to one or more walls of the case 110. The memory modules 130 are also inserted into the case body through the opening 117, and may be installed in the memory sockets 141 in the PCB 120. In these examples, the memory modules 130 may be installed in the memory sockets 141 before or after the PCB 120 is inserted in the case body. Once the PCB 120 and memory modules 130 are both installed within the case body, the case lid (e.g., the top wall 112 or the side wall 113 in implementations 100A-D) is then sealed to the case body, thus forming the liquid coolant chamber 150 with the memory modules 130 inside the chamber 150 (see FIGS. 2, and 5-7). In the implementations 100A, 100C, and 100D the top wall 112 or side wall 113 is permanently sealed to the other walls, while in implementation 100B the top wall 112 is reversibly sealed to the side walls 113.

In implementation 100E, the PCB 120 acts as the bottom wall 111 of the case 110, and the PCB 120 is the case lid that is initially disconnected from the rest of the case 110 (the case body). In this example, the memory modules 130 are installed in memory sockets 141 on the PCB 120 before being inserted into the case body via the opening 117. The PCB 120 with the installed memory modules 130 may then be moved into position to be sealed to the side walls 113, and in doing so the memory modules 130 are inserted into the interior of the case body via the opening 117. The PCB 120 is then sealed to the side walls 113, thus forming the liquid coolant chamber 150 with the memory modules 130 inside the chamber 150 (See FIG. 8).

As noted above, in some examples the case 110 may include hose connectors 115. These hose connectors 115 may provide openings 116 into the liquid coolant chamber 150, through which liquid coolant may flow. Thus, in such examples, the liquid coolant chamber 150 may be connected into a liquid coolant flow of a liquid cooling system via the hose connectors 150. The hose connectors 115 may be any type of hose connector. For example, the hose connectors 115 may be barb connectors, which include barbs to engage with a hose. As another example, the hose connectors 115 may be dry-disconnect couplings, which may allow the openings 116 to be closed liquid tight when desired (such as when connecting or disconnecting a hose) and opened when desired (such as during normal operation).

In some examples that include hose connectors 115, the liquid coolant chamber 150 might not be completely liquid-tight (or may be completely liquid tight at some times but not at other times), since liquid may be able to flow into or out of the chamber 150 through the openings 116. Thus, the liquid coolant chamber 150 is described herein as being "liquid-tight excluding any hose connectors", which means that that the entire liquid coolant chamber 150 is liquid tight with the possible exception of the openings 116 of hose connectors 115, it there are any.

In some examples, such as implementation 100F, an additional PCB 123 may also be included within the memory device 100, which may also include memory sockets 141 in which memory modules 130 are installed. In such examples, the additional PCB 123 may be positioned opposite to the PCB 120, such that the memory modules 130 are interleaved as shown in FIG. 9. This may allow more memory modules 130 to be fit within the memory device 100 without a significant increase to the size of the memory device 100. In particular, in some examples the sockets 141 may impose a minimum spacing between memory modules 130 installed in the same PCB that results in less efficient packing of the memory modules 130 within the chamber 150. However, by interleaving the memory modules 130 from two opposing PCBs (i.e., the PCB 120 and the additional PCB 123), the spacing between memory modules 130 may be decreased below the minimum spacing allowed by the sockets 141, thereby increasing the number of memory modules 130 that can be fit within the same volume. Such close spacing of memory modules 130 might make air cooling of the memory modules 130 difficult as it may inhibit air flow, but in the memory device 100 this is not a problem as the memory modules 130 are housed within the liquid coolant chamber 150 and surrounded by liquid coolant. Although FIG. 9 illustrates both the PCB 120 and the additional PCB 123 as being disposed completely within the case 110, in examples that include the additional PCB 123 either or both of the PCB 120 and the additional PCB 123 may act as a wall of the case 110.

2.3—the Memory Bus 140

The memory bus 140 is to electrically connect the memory modules 130 to a memory bus of the main PCB of a computer. Thus, the memory bus 140 may include memory sockets 141 that are to provide electrical connections with installed memory modules 130, an external connector 145 to connect to the memory bus of the main PCB of the computer, and wirings to connect the memory sockets 141 to the external connector 145.

For example, each memory socket 141 may include a slot in which a memory module 130 is inserted, and contacts 146 in the slot that may physically contact corresponding portions of the memory modules 130 to provide electrical interfaces between signal lines of the memory modules 130 and signal lines of the memory bus 140. The contacts 146 may also help physically secure the memory modules 130 in the memory sockets 141. Additional mechanisms for securing the memory modules 130, such as latches (not illustrated), may be included. The form factors of the memory modules 130 and memory sockets 141 are not limited herein. Any number of memory sockets 141 and memory modules 130 may be included in the memory device 100.

The external connector 145 may also include electrical contacts (not illustrated) for interfacing with complementary contacts of a connector of the memory bus of the main PCB of the computer. The form factor of the external connector 145 is not limited herein, aside from it being able to communicably couple with a complementary connector of a memory bus of the main PCB. In some examples, the main PCB may have a special-purpose connector designed specifically to couple with the external connector 145. In some examples, the external connector 145 and the corresponding connector of the main PCB may be standardized connectors according to any standard, such as HyperTransport Expansion (HTX), Peripheral Component Interconnect Express (PCIe), etc. In some examples, the connector 145 may have the same connector form factor as a memory module according to a memory module standard, and thus may be directly connected to a memory socket of the main PCB. Although the external connector 145 is described above in the singular form for convenience, in some examples there may be more than one external connector 145 (for example, one per memory module 130).

As can be seen in FIGS. 2-8, the memory bus 140 extends from within the liquid coolant chamber 150 to outside of the liquid coolant chamber 150. Specifically, the memory sockets 141 are within the liquid coolant chamber 150 and the external connector 145 is outside the liquid coolant chamber 150, and the memory sockets 141 are connected to the external connector 145 via wirings (see FIGS. 1-8). In particular, wirings 142 connect to the memory sockets 141 on a top side of the PCB 120, extend through the PCB 120 to the bottom side of the PCB 120 in a region of the bottom side that is outside of the chamber 150, and then connect to the external connector 145 either directly or via intermediaries such as the bottom interface 143 and wirings 144 (see FIGS. 1-8).

In some examples, such as the example implementations 100A, 100C, and 100D, the external connector 145 is fully external to both the liquid coolant chamber 150 and the case 110 (see FIGS. 1-4 and 6-8). In some of these examples, the bus 140 includes external wirings 144 to connect the external connector 145 to the wirings 142 (perhaps via an interface 143). In examples that include them, the external wirings 144 may be arranged in any convenient manner. For example, in implementations 100A and 100C, the wirings 144 are housed within a flexible sheathing, which extends through a hole 114 in the bottom wall 111 (see FIGS. 2, 3, and 6). As another example, in implementation 100D, the wirings 144 are housed within in a rigid or semi-rigid right angle connector that extends through the hole 114 (See FIG. 7). In other examples, such as implementation 100E, the external connector 145 is connected to the wirings 142 either directly or via a bottom interface 143 with no need for external wirings 144. In some examples, having the wirings 144 be housed within a flexible sheathing (cable) may allow greater freedom in where the memory device 100 may be disposed in relation to the processor when installed in the computer.

In some examples, the external connector 145 is not fully external to the case 110—in other words, at least part of the external connector 145 is interior to the outer surface of the case 110 (see FIG. 5) (in such examples, the external connector 145 is still referred to as "external" because it is external to the chamber 150). For example, in implementation 100B, the entire external connector 145 is interior to the outer surface of the bottom wall 111 of the case 110. In these examples, the opening 114 may be included in the bottom wall 112 of the case 110 to provide access to the external connector 145 from outside of the case 110. For example, a connector of the main PCB of the computer may extend (fully or partially) through the hole 114 to couple with the external connector 145.

As noted above, in some examples the bus 140 includes a bottom interface 143. The bottom interface 143 may provide physical and electrical connections between the wirings 142 and the wirings 144 and/or external connector 145. In some examples, the bottom interface 143 may also provide additional functionality, such as buffering or amplifying signals carried on the wirings 142/144.

In some examples, the bus 140 may be designed to provide passive electrical connections between the memory modules 130 and the memory bus of the main PCB, without any other active involvement in the communication process. In other examples, the bus 140 may include active circuitry, such as an application specific integrated circuit (ASIC) or other logic circuitry, which is to provide some active function to facilitate communication between the memory modules 130 and the main PCB. For example, such active circuitry could include voltage regulation circuitry that is to regulate a supply voltage to the memory modules. As another example, such active circuitry could provide functions such as buffering or amplification of signals, security (authentication, encryption, etc.), protocol translation, bus control, etc. Such active circuitry could be, but need not necessarily be, included in the bottom interface 143. In some examples, the active circuitry may be a memory controller; in other words, the active circuitry may provide some or all of functions in relation to the memory modules 130 that a memory controller in the main PCB would have provided if the memory modules 130 had been installed directly in the main PCB.

As noted above, in some examples, such as implementation 100F, an additional PCB 123 may be included in the memory device 100. In some of these examples, the memory bus 140 may also include the memory sockets 141 of the additional PCB 123 as well as wirings that connect these memory sockets 141 to the external connector 145. In other words, in these examples the same memory bus (namely, memory bus 140) is connected to both the PCB 120 and the additional PCB 123. For example, as illustrated in FIG. 9, the memory sockets 141 of the additional PCB 123 may be connected to the external connector 145 via wirings 142 of the additional PCB 123 that connect to an internal cable 147 that connect to the wirings 142 of the PCB 120, that connect to the external connector 145 (possibly through additional wirings, such as the wirings 144). In other examples (not illustrated), the memory device 100 includes an additional memory bus (not illustrated) that includes the memory sockets 141 of the additional PCB 120. In other words, in these other examples different memory busses are provided for the PCB 120 and the additional PCB 123. For example, the additional memory bus may extend through a hole in a wall of the case 110 in a manner similar to how the memory bus 140 extends through the hole 114, in which case the additional PCB 123 may be sealed to the case 110 to keep the liquid coolant chamber liquid tight. In some examples in which there is an additional memory bus, the additional memory bus includes an additional external connector (not illustrated) that is to connect to a memory bus of the main PCB of the computer, similar to the external connector 145.

2.4—Heat Removal

Different implementations of the memory device 100 may remove heat from the liquid coolant chamber 150 in different ways. In particular, all of the example implementations of the memory device 100 described herein use liquid coolant in the liquid coolant chamber 150 to remove heat from the memory modules 130; however, this heat held by the liquid coolant may then be transferred out of the liquid coolant chamber 150 in various ways.

For example, some implementations of the memory device 100 include hose connectors 115 for connecting the memory device 100 into a liquid cooling system of the computer in which the memory device 100 is to be installed. In such examples, the heat is removed from the liquid coolant chamber 150 by the circulation of the liquid coolant through the liquid cooling system. In other words, hot liquid coolant flows out of the liquid coolant chamber 150 though one hose connector 115 and cold liquid coolant flows into the liquid coolant chamber 150 through another hose connector 115.

In other examples in which no hose connectors 115 are included in the memory device, the heat is removed from the liquid coolant by conduction through the walls of the case 110. In particular, the case 110 may be thermally coupled to a cold plate. The cold plate may be part of any cooling system of the computer; for example, the cold plate may be a cold plate of a liquid cooling system or a heat sink of an air cooling system. In some examples, the cold plate may also be tasked with cooling another component of the computer besides the memory device 100, such as the processor.

In some examples, the thermal coupling between the case 110 and the cold plate may be achieved by the case 110 being in direct contact with the cold plate (or the case being in contact with a thermal interface material that is in contact with the cold plate). In other examples, a heat transfer element may extend between the case 110 and the cold plate to thermally couple the case 110 and the cold plate.

Figure 10:
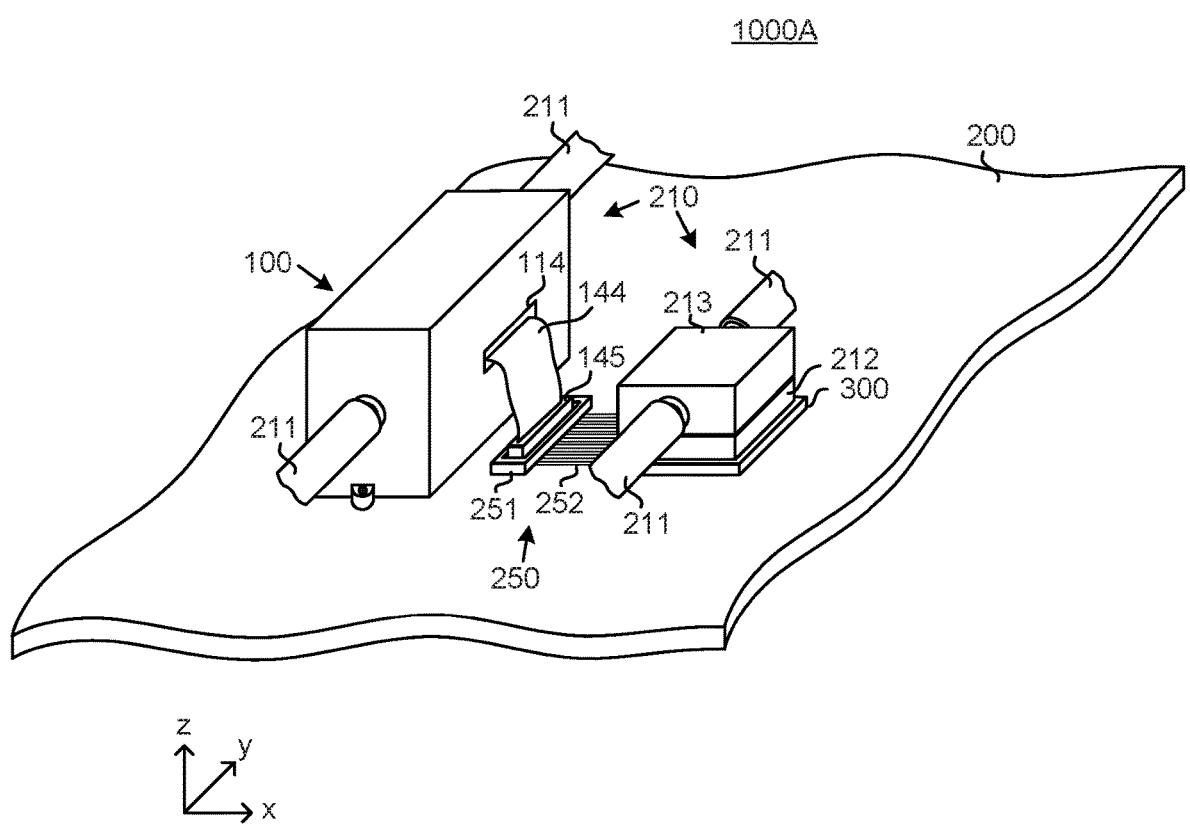
FIG. 10 illustrates a perspective view of a first example computing device that includes the first example memory device.

In some examples in which a heat transfer element thermally couples the case 110 to the cold plate, the heat transfer element may be a heat conduit 160 that is connected to the case 110 at one end and to the cold plate at the other end (see FIGS. 6 and 10). The heat conduit 160 may be any object that is distinct from the case 110 and is thermally conductive or highly thermally conductive, such as a heat pipe (vapor pipe), solid metal bar, etc. In some examples, the heat conduit 160 may be separate from the memory device 100 when the memory device 100 is manufactured and/or sold, and may be connected to the case 110 when the memory device 100 is installed in a computer. In other examples, the heat conduit 160 may be part of the memory device 100 and already connected to the case 110 when the memory device is manufactured and/or sold.

In some examples, such as implementation 100C, the heat conduit 160 may be embedded within one of the walls of the case 110 (e.g., via insert-injection molding), meaning that part of the wall has been formed around part of the heat conduit 160 (see FIG. 6). In some such examples, the heat conduit 160 may be embedded within the case 110 such that a portion of the heat conduit 160 extends into the liquid coolant chamber 150, thereby enabling the liquid coolant to come into direct contact with the heat conduit 160 (see FIG. 6).

In some examples (not illustrated), the heat conduit 160 may be connected to the outside of the case 110 (possibly with a thermal interface material in between). In some of these examples, the wall of the case 110 that the heat conduit 160 is connected to may be made of a thermally conductive material, or a highly thermally conductive material.

In other examples in which a heat transfer element thermally couples the case 110 to the cold plate, the heat transfer element may be a protrusion 162 from the case 110, the protrusion being part of the same continuous body as a given wall of the case 110. In particular, such a protrusion 162 may extend outward from the case 110 such that it can be connected with the cold plate. For example, in implementation 100D, the protrusion 162 is part of the same continuous body as one of the side walls 113 (see FIGS. 7 and 11). In such examples, the protrusion 162 may be thermally conductive or highly thermally conductive, and since the protrusion 162 is part of the same continuous body as the given wall of the case 110 this means the given wall is also thermally conductive or a highly thermally conductive. For example, the given wall and the protrusion 162 may be parts of a continuous body formed of a highly thermally conductive material, such as copper. In some examples, the given wall of the case 110 may also be the case lid that is disconnected from the rest of the case when the memory modules 130 are being inserted into the case 110.

In some examples, the walls of the case 110 that are not connected to or part of the same continuous body as the heat transfer element may be made of a material that is thermally insulating. In some examples, the walls of the case 110 that are not connected to or part of the same continuous body as the heat transfer element may be thermally insulated by, for example, surrounding the walls with a thermally insulating material. These measures may reduce the amount of heat that is transferred from the memory device 100 to the ambient environment.

3—Example Computer 1000

Figure 11:
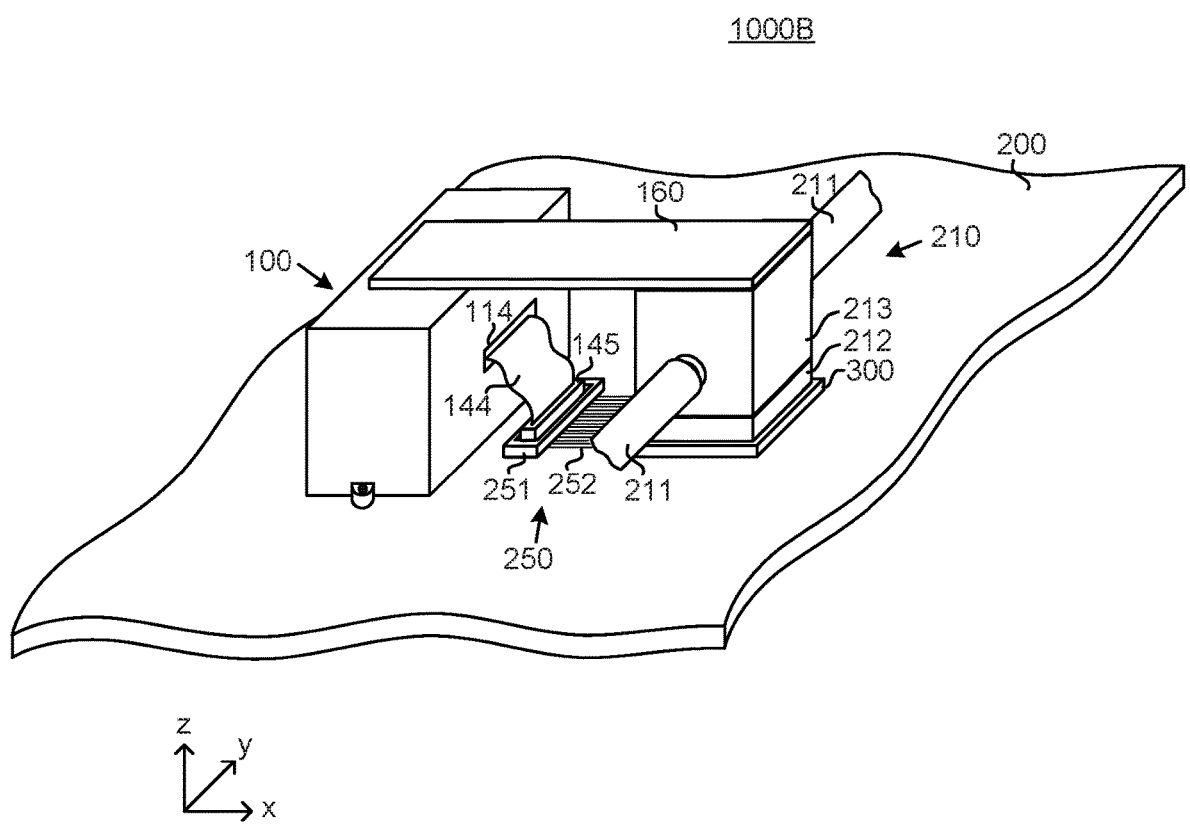
FIG. 11 illustrates a perspective view of a second example computing device that includes the third example memory device.
Figure 12:
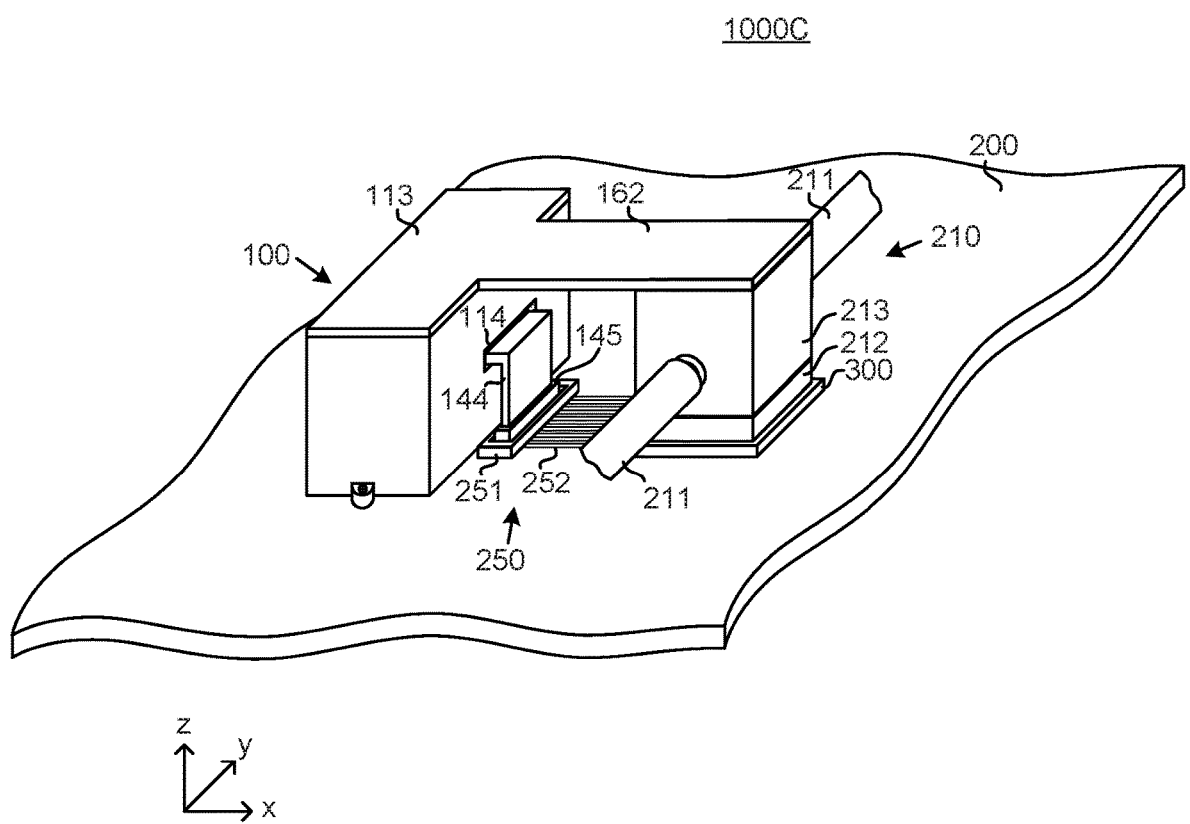
FIG. 12 illustrates a perspective view of a third example computing device that includes the fourth example memory device.

FIGS. 10-12 illustrate an example computer 1000, which includes the example memory device 100 described above. FIG. 10 illustrates a first example implementation of the computer 1000 (hereinafter "implementation 1000A") in which the implementation 100A of the memory device 100 is used. FIG. 11 illustrates a second example implementation of the computer 1000 (hereinafter "implementation 1000B") in which the implementation 100C of the memory device 100 is used. FIG. 12 illustrates a third example implementation of the computer 1000 (hereinafter "implementation 1000C") in which the implementation 100D of the memory device 100 is used.

The computer 1000 includes a main PCB 200, the memory device 100, and a cooling system 210. The main PCB 200 may include a processor 300 and a memory bus 250 to connect memory modules to the processor 300. The main PCB 200 may also include any additional components (not illustrated), such as I/O controllers, a memory controller, disk controllers, communications controllers, read-only-memory (ROM), expansion slots, etc. The computer 1000 may also include one or more removable or peripheral components (not illustrated) that may be connected to the main PCB 200, such as storage devices, expansion cards, etc. Although only one processor 300 is described for simplicity, the computer 1000 may include any number of processors 300, each of which may include any number of cores. The processor 300 may include any circuitry that is capable of executing machine readable instructions, including a processor, a central processing unit (CPU), microprocessor, microcontroller, field-programmable gate array (FPGA), complex programmable logic device (CPLD), digital signal processor, graphics processor, coprocessor, etc.

The memory bus 250 may include a connector 251 and wirings 252. The connector 251 may be complementary to the connector 145 of the memory device 100, such that connecting the connector 251 and the connector 145 together establishes electrical connections between signal lines of the memory bus 140 and signal lines of the memory bus 250. The wirings 252 connect the connector 251 to the processor 300. In some examples, the wirings 252 may connect directly to the processor 300, while in other examples the wirings 252 may be connected to the processor 300 via an intermediary, such as a memory controller, Northbridge, etc.

The cooling system 210 may be any cooling system that is to cool one or more components of the computer 1000. For example, the cooling system 210 may be a liquid cooling system that uses liquid coolant to cool components of the computing device 1000. As another example, the cooling system 210 may be an air cooling system that uses air to cool components. The cooling system may include a cold plate 213, which is to transfer heat from a component to a heat removal medium (e.g., liquid coolant or air).

In examples, in which the cooling system 210 is a liquid cooling system, it may include a number of hoses (tubes) 211, connectors (not illustrated), manifolds (not illustrated), cold plates (including the cold plate 213), reservoir(s) (not illustrated), heat exchanger(s) (not illustrated), pump(s) (not illustrated), and the like, which together may form a closed loop (which may have one or more branches) through which liquid coolant is caused to flow. The heat exchanger (not illustrated) may be part of the computing device 1000 or separate from the computing device 1000, and may remove heat from the liquid coolant.

In some examples, such as the first implementation 1000A, the cooling system 210 is a liquid cooling system and the liquid coolant chamber 150 of the memory device 100 is connected into a branch of the cooling system 210 via the hose connectors 115 and hose 211 (see FIG. 10). In such examples, liquid coolant from the cooling system 210 flows through the liquid coolant chamber of the memory device 100 via the openings 116 of the hose connectors 115. In some of these examples, the same cooling system 210 into which the memory device 100 is connected may also cool another component of the computer 100, such as the processor 300 (see FIG. 10), while in other examples the cooling system 210 may be provided solely for the memory device 100 (not illustrated). In particular, as illustrated in FIG. 10, the cooling system 210 may include a cold plate 213 to cool the processor 300 (for example, with a heat spreader 212 in between), with the cold plate 213 being connected into the cooling system 210 via hoses 211.

In some examples, such as the second implementation 1000B, the liquid coolant chamber 150 of the memory device 100 is completely sealed, and the memory device 100 dissipates heat via a heat conduit 160 that is connected to the cold plate 213 of the cooling system 210 (see FIG. 11). In some examples (not illustrated), the cold plate 213 may be provided specifically for the memory device 100 and not to cool any other components of the computer, while in other examples (see, e.g., FIG. 11) the cold plate 213 that cools the memory device 100 may also cool another component of the computer, such as, for example, the processor 300. In some examples, the cooling system 210 is a liquid cooling system (see FIG. 11), while in other examples the cooling system 210 is some other type of cooling system, such as an air cooling system (not illustrated). For example, in FIG. 11, the heat conduit 160 is connected to the cold plate 213 of the liquid cooling system 210, which is thermally coupled with the processor 300.

In some examples, such as the third implementation 1000C, the liquid coolant chamber 150 of the memory device 100 is completely sealed, and the memory device 100 dissipates heat via a wall of the case 110 that is thermally coupled to the cold plate 213 of the cooling system 210 (see FIG. 12). In some examples, the cold plate 213 may be provided specifically for the memory device 100, while in other examples the cold plate 213 may also cool another component of the computer, such as the processor 300. In some examples, the cooling system 210 is a liquid cooling system (see FIG. 11), while in other examples the cooling system 210 is some other type of cooling system, such as an air cooling system (not illustrated). For example, as illustrated in FIG. 12, a protrusion 162 from the case 110, which is part of the same continuous body as a wall of the case 110, may be connected to the cold plate 213 to thermally couple the wall of the case 110 to the cold plate 213. As another example (not illustrated), a wall of the case 110 may directly contact the cold plate 213 (or may contact a thermal interface material that is in contact with the cold plate 213) without any protrusion.

4—Example Methods

Figure 13:
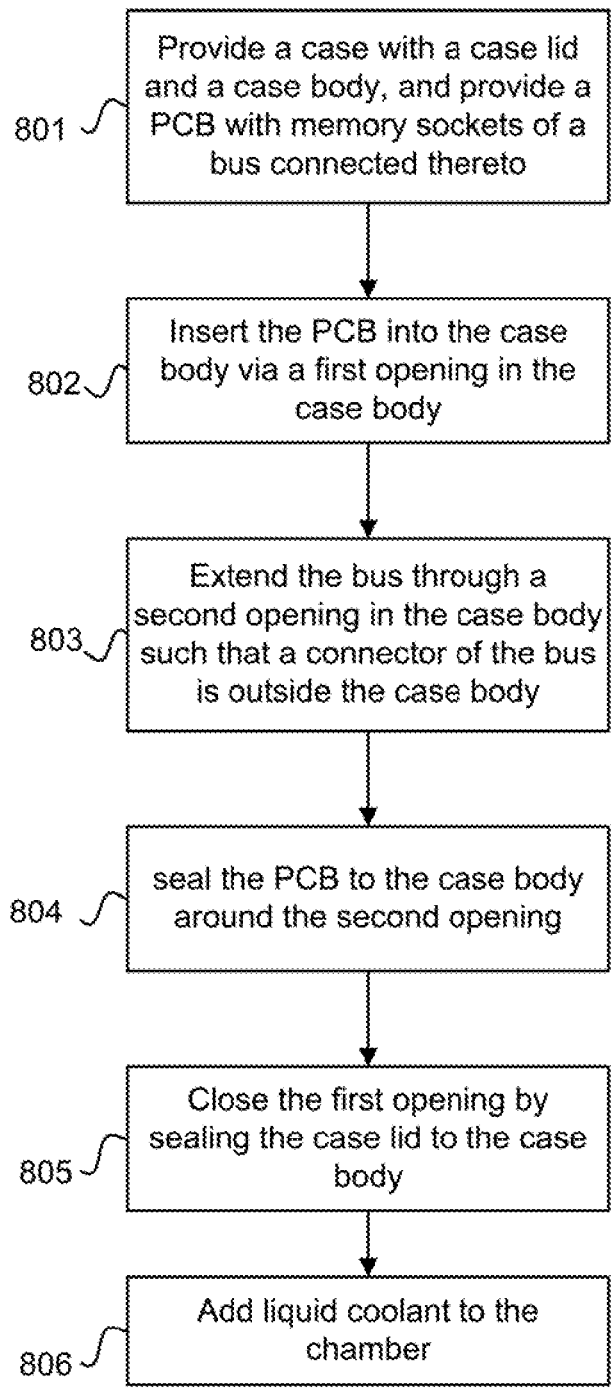
FIG. 13 is a process flow chart illustrating an example process of manufacturing an example memory device.

FIG. 13 illustrates an example method of manufacturing a memory device, such as the example memory device 100.

In block 801, a case and a PCB are provided. The case includes a case body and a case lid. The case body and the case lid are such that a first opening in the case body may be closed by sealing the lid to the case body, whereupon the case becomes a closed box (closed with the exception of a second opening in one wall of the case and the possible exception of hose connectors, if any). For example, the case body may include five walls of the case that are sealed to one another, forming a box with a first opening. The first opening may correspond to where a lid of the unsealed case will eventually go (e.g., the opening 117), while the second opening may be a hole in one of the walls of the case (e.g., the hole 114). The PCB may have a bus connected to it that includes memory sockets connected to a connector that is to connect to a main printed circuit board of a computing device—for example, the PCB may be the PCB 120 described above. In particular, the memory sockets of the bus may be connected to one side of the PCB, and wirings that are connected to the memory sockets may extend to an opposite side of the PCB, with the connector being connected directly or via intermediaries to the wirings.

In block 802, the PCB is inserted into the case body via the first opening.

In block 803, the bus is extended through the second opening such that the connector is outside of the case body while the PCB is within the case body. For example, the bus may include external wirings that connect the connector to the PCB, and the connector and the external wirings may be fed through the second opening.

In block 804, the PCB is sealed to an interior of the case body around the second opening. The sealing may be such that a region within the case body (which will ultimately correspond to the liquid coolant chamber when the first opening is closed) is liquid-tight relative to the second opening.

In block 805, while the PCB is sealed to the case body and memory modules are within case body and installed in the memory sockets, the first opening is closed by sealing the case lid to the case body, thereby forming a liquid coolant chamber within the case that is liquid-tight excluding any hose connectors.

In block 806, liquid coolant is added to the chamber. In some examples, block 806 is performed prior to closing the case (prior to block 805); for example, the liquid coolant may be poured via the first opening into the region in the interior of the case that will ultimately correspond to the liquid coolant chamber. In other example, block 805 may be performed after closing the case (after block 806)—for example, if the case includes hose connectors, the liquid coolant may be added to the chamber via the hose connectors.

Note that it is implicit that the memory modules have been installed in the memory sockets and are within the case when the first opening is closed in block 805. However, the act of installing the memory modules in the memory sockets is not necessarily part of the example method. For example, the memory modules may already be installed (perhaps by a third party) in the provided PCB, in which case the example method does not include installing the memory modules. However, in examples in which the memory modules are not already installed in the memory sockets of the provided PCB, the example method may include installing the memory modules in the memory sockets prior to closing the first opening. In examples in which the method does include installing the memory sockets in the PCB, this may be done at any time between block 801 and block 805.

The operations described above could be performed in different orders than that described above and illustrated in FIG. 8, subject to a few limitations. Moreover, multiple operations may be performed concurrently. For example, the bus could be extended through the second opening (block 803) before the PCB has been inserted into the case body (block 802) (assuming the bus has a sufficiently long external wiring). As another example, the PCB may be sealed to the case body (block 804) before the bus is extended through the second opening (block 803). As another example, the liquid coolant could be added to the chamber (block 806) before the first opening is closed (block 805). As another example, the first opening may be closed (block 805) before the bus is (fully) extended through the second opening (block 803). As another example, the inserting of the PCB into the case body (block 802) and the extending of the bus through the second opening (block 803) may be performed concurrently. Limitations on the ordering of the operations include: (1) block 801 is performed prior to any of blocks 802-806, (2) block 804 should be performed after block 802, (3) block 805 should be performed after block 802, and (4) block 806 should be performed after block 804.

In addition, multiple operations may be performed as part of the same single action or group of actions. That is, the fact that two (or more) operations are described separately herein (or recited as part of different elements in the appended claims) does not necessarily imply that the operations must be performed by distinct actions. For example, in some examples the PCB may be inserted into the case body (block 802) and the bus may be extended through the second opening (block 803) as part of the same single action.

For ease of understanding, five specific example implementations of the memory device 100 are illustrated in FIGS. 1-8, but it should be understood that the example memory device 100 may be implemented in other ways which are not specifically illustrated. In particular, implementations of the example memory device 100 include at least every possible combination or permutation of the features that are illustrated in FIGS. 1-8 and described above, (excluding logically or physically impossible combinations). In other words, the memory device 100 is not limited to the specific combinations of features found in the implementations 100A-E, and these features may be "mixed-and-matched" in other implementations of memory device 100. In particular, example implementations of the memory device 100 include all permutations of the following set of features, where each permutation selects one variation of each feature in the following list, with variations being as described above (some example variations are listed in parenthesis for convenience): (A) the form factor of the memory bus 140 (e.g., flexible sheathing for the external wiring 144, a right angle connector for the external wiring 144, no external wiring 144, etc.), (B) how the PCB 120 is sealed to the case 110 (e.g., adhesive 122, mechanical fasteners 121 and gasket 122, etc.), (C) which walls of the case 110 the PCB 120 is sealed to (e.g., PCB 120 sealed to bottom wall 111, PCB 120 sealed to side walls 113, etc.), (D) the relationship of the PCB 120 and the case 110 (e.g., the PCB 120 acts as a wall of the case 110, the PCB 120 is not a wall of the case 110 and is included within the case 110), (E) how the case lid is sealed to the case body (e.g., the case lid is permanently sealed to the case body, the case lid is releasably sealed to the case body, etc.), (F) hose connectors 116 (e.g., there are some, there are none), (G) how the external connector 145 is located relative to the case 110 (e.g., it is fully outside of the case 110, it is at least partially within the case 110), (H) a heat transfer element (e.g., no heat transfer element is included, a heat conduit 160 is included as a heat transfer element, a protrusion 162 from case 110 is included as a heat transfer element, etc.), and (I) whether there is an additional PCB 123.

Similarly, for ease of understanding, three specific example implementations of the computer 1000 are illustrated in FIGS. 9-11, but it should be understood that the example computer 1000 may be implemented in other ways which are not specifically illustrated.

In addition, the example memory device 100 and the example computer 1000 may include additional features that are not described herein and/or may omit some of the features described herein.

As used herein, "liquid-tight" means impervious to a liquid coolant at temperatures between 20° and 100° C. and a particular pressure.

As used herein, to "thermally couple" two objects means to provide a conductive pathway between the objects that allows heat to be conducted between the objects. This includes placing the two objects in direct contact with one another, as well as placing the objects in direct contact with one or more thermally conductive intermediaries (such as thermal interface material and/or a heat transfer element), which are successive in contact with one another.

As used herein, a "computer" is any electronic device that includes a processor and that is capable of executing programs comprising machine-readable instructions, including, for example, a server, a converged (or hyperconverged) appliance, a rack-scale system, some storage arrays, a personal computer, a laptop computer, a smartphone, a tablet, etc.

As used herein, to "permanently seal" two objects means that the objects are sealed together in such a way the seal between the objects cannot be broken without causing damage to one or both of the objects and/or the sealing mechanism. Examples of ways to permanently seal two objects together include fusing the objects together and using adhesive to bond the objects together.

As used herein, to "reversibly seal" two objects means that the objects are sealed together in such a way that the seal between the objects can be broken without causing damage to any of the objects or the sealing mechanism. An example of a way to reversibly seal two objects is to fasten them together with a releasable mechanical fastener with a gasket between them.

As used herein, an object comprising a continuous body of the same material is considered "thermally conductive" if the material forming the object is "thermally conductive". As used herein, a material is "thermally conductive" if it has thermal conductivity (often denoted k, $\lambda$, or $\kappa$) of 1 $W \cdot m^{-1} \cdot K^{-1}$ or greater at any temperature between 0° C. and 100° C. Examples of materials that are thermally conductive include almost all metals and their alloys (e.g., copper, aluminum, gold, etc.), some plastics (e.g., TECACOMP® TC compounds, CoolPoly® D-series Thermally Conductive Plastics), and many other materials. As used herein, a material is "highly thermally conductive" If it has thermal conductivity of 100 $W \cdot m^{-1} \cdot K^{-1}$ or greater at any temperature between 0° C. and 100° C. Examples of materials that are highly thermally conductive include copper, silver, gold, aluminum, and many other metals and their alloys.

As used herein, an object comprising multiple distinct bodies (possibly of different materials) is considered "thermally conductive" if the object as a whole has a heat transfer coefficient of 10 $W \cdot m^{-2} \cdot K^{-1}$ or greater from one end of the object to the other end of the object at any temperature between 0° C. and 100° C., and is considered "highly thermally conductive" if the object as a whole has a heat transfer coefficient of 1000 $W \cdot m^{-2} \cdot K^{-1}$ or greater from one end of the object to the other end of the object at any temperature between 0° C. and 100° C. An example of a highly thermally conductive object that comprises multiple distinct bodies is a heat pipe. A heat pipe generally comprises an elongated hollow tube of a thermally conductive material (e.g., copper) that has liquid/vapor material in the tube along with a wicking mechanism and a vapor passageway. In such a heat pipe, the liquid vaporizes at a hot end of the pipe as it absorbs heat, the vapor flows through the vapor passageway to the cold end of the heat pipe and condenses back into liquid as it releases heat, and then the condensed liquid is wicked back to the hot side of the heat pipe by the wicking mechanism to start the cycle again. Thus, heat is transferred from the hot side of the pipe to the cold side of the pipe by the vapor. The rate of heat transfer by such heat pipes can be equal to and often higher than the rate of heat transfer that could be obtained by comparably sized/shaped heat conduits that are formed of a single continuous piece of metal.

As used herein, to "provide" an item means to have possession of and/or control over the item. This may include, for example, forming (or assembling) some or all of the item from its constituent materials and/or, obtaining possession of and/or control over an already-formed item.

Throughout this disclosure and in the appended claims, occasionally reference may be made to "a number" of items. Such references to "a number" mean any integer greater than or equal to one. When "a number" is used in this way, the word describing the item(s) may be written in pluralized form for grammatical consistency, but this does not necessarily mean that multiple items are being referred to. Thus, for example, a phrase such as "a number of active optical devices, wherein the active optical devices . . . " could encompass both one active optical device and multiple active optical devices, notwithstanding the use of the pluralized form.

The fact that the phrase "a number" may be used in referring to some items should not be interpreted to mean that omission of the phrase "a number" when referring to another item means that the item is necessarily singular or necessarily plural.

In particular, when items are referred to using the articles "a", "an", and "the" without any explicit indication of singularity or multiplicity, this should be understood to mean that there is "at least one" of the item, unless explicitly stated otherwise. When these articles are used in this way, the word describing the item(s) may be written in singular form and subsequent references to the item may include the definite pronoun "the" for grammatical consistency, but this does not necessarily mean that only one item is being referred to. Thus, for example, a phrase such as "an optical socket, wherein the optical socket . . . " could encompass both one optical socket and multiple optical sockets, notwithstanding the use of the singular form and the definite pronoun.

Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Various example processes were described above, with reference to various example flow charts. In the description and in the illustrated flow charts, operations are set forth in a particular order for ease of description. However, it should be understood that some or all of the operations could be performed in different orders than those described and that some or all of the operations could be performed concurrently (i.e., in parallel).

While the above disclosure has been shown and described with reference to the foregoing examples, it should be understood that other forms, details, and implementations may be made without departing from the spirit and scope of this disclosure.

What is claimed is:

1. A memory device comprising:
   an ancillary printed circuit board (PCB) including an ancillary PCB bus that includes memory sockets and a bus connector allowing connection to a memory bus of a main PCB of a computing device;
   a case comprising a number of walls, wherein at least one of a given one of the walls of the case or a heat conduit extends from the case to a cold plate included in a cooling system of the computing device and at least some of the walls and the ancillary PCB together form a liquid coolant chamber with the memory sockets located within the liquid coolant chamber and the bus connector outside the liquid coolant chamber, the bus connector allowing connection external to the liquid coolant chamber; and
   memory modules installed in the memory sockets, the memory modules being within the liquid coolant chamber to be cooled by immersion cooling, in operation, using a liquid coolant internal to the liquid coolant chamber and isolated from the main PCB.

2. The memory device of claim 1, further comprising:
   at least one heat transfer mechanism to, in operation, transfer heat from within the liquid coolant chamber to the cooling system of the computing device, wherein the at least one heat transfer mechanism includes at least one hose connector to provide fluid connectivity of the liquid coolant chamber to the cooling system.

3. The memory device of claim 2, wherein a number of the at least one hose connector provides the at least one heat transfer mechanism and fluidly connects the liquid coolant chamber to the cooling system of the computing device.

4. The memory device of claim 1, further comprising:
   at least one heat transfer mechanism to, in operation, transfer heat from within the liquid coolant chamber, wherein the at least one heat transfer mechanism includes the heat conduit that is connected to the given one of the walls of the case, extends outward from the case, and is to connect to the cold plate of the cooling system of the computing device.

5. The memory device of claim 1, wherein the bus connector is external to the case and the ancillary PCB bus extends from inside the liquid coolant chamber to outside the case via a first opening in the case, and
   the ancillary PCB is sealed to the case.

6. The memory device of claim 1, wherein the bus connector is not outside of the case and is accessible from outside of the case via a first opening in the case, and
   the ancillary PCB is sealed to the case.

7. The memory device of claim 1, wherein one of the walls of the case is reversibly sealed to others of the walls of the case.

8. The memory device of claim 1, wherein
   the bus connector is to communicably connect all of the memory modules installed in the memory sockets to the memory bus of the main PCB.

9. A computing device, comprising: a main printed circuit board (PCB) that includes a processor and a memory bus, the memory bus connecting to the processor and including a first connector;
   a memory device comprising:
   an ancillary PCB including an ancillary PCB bus that includes memory sockets and a bus connector;
   a case comprising a number of walls, wherein at least some of the walls and the ancillary PCB together form a liquid coolant chamber with the memory sockets located within the liquid coolant chamber; and
   memory modules installed in the memory sockets, the memory modules being within the liquid coolant chamber to be cooled by immersion cooling, in operation, using a liquid coolant internal to the liquid coolant chamber and isolated from the main PCB,
   wherein the bus connector is external to the liquid coolant chamber and connected to the first connector to form a bus connection between the ancillary PCB bus and the memory bus; and
   a cooling system that includes a cold plate, wherein at least one of a given one of the walls of the case or a heat conduit extends from the case to the cold plate.

10. The computing device of claim 9, wherein
    the heat conduit that is connected to the given one of the walls and to the cold plate, and thermally couples the given one of the walls to the cold plate.

11. The computing device of claim 10, wherein the heat conduit is embedded within the given one of the walls such that at least a portion of the heat conduit is in direct contact with the liquid coolant in the liquid coolant chamber.

12. The computing device of claim 9, wherein the case includes a protrusion that: is a part of a continuous body including the given one of the walls, protrudes outward from the case, is connected to the cold plate, and thermally couples the given one of the walls to the case.

13. The computing device of claim 9, further comprising:
a number of hose connectors disposed in one or more of the walls of the case that are connected to hoses of the cooling system such that the liquid coolant chamber is part of a closed loop that contains the liquid coolant.

14. The computing device of claim 9, wherein the bus connector is external to the case and the ancillary PCB bus extends from inside the liquid coolant chamber to outside the case via a first opening in the case, and
the ancillary PCB is sealed to the case.

15. The computing device of claim 9, wherein the bus connector is not outside of the case and is accessible from outside of the case via a first opening in the case, and
the ancillary PCB is sealed to the case.

16. The computing device of claim 9, wherein one of the walls of the case is reversibly sealed to others of the walls of the case.

17. The computing device of claim 9, wherein
the bus connector is to communicably connect all of the memory sockets, via the ancillary PCB bus, to the first connector of the memory bus of the main PCB.

\* \* \* \* \*